US012649835B2

(12) United States Patent
Xu et al.

(10) Patent No.: US 12,649,835 B2
(45) Date of Patent: Jun. 9, 2026

(54) ULTRASTRONG AEROGELS BASED ON ARAMID NANOFIBER COMPOSITES AND MEMBRANE DEVICES MADE THEREFROM

(71) Applicants:THE UNIVERSITY OF HONG KONG, Hong Kong (CN); Advanced Biomedical Instrumentation Centre Limited, Hong Kong (CN)

(72) Inventors: Lizhi Xu, Changsha (CN); Hegeng Li, Wuhan (CN); Hongzhen Liu, Shenzhen (CN); Huimin He, Kaihua (CN); Zuochen Wang, Langzhou (CN)

(73) Assignees: VERSITECH LIMITED, Hong Kong (CN); Advanced Biomedical Instrumental Centre Limited, NT (CN)

( * ) Notice: Subject to any disclaimer, the term of this patent is extended or adjusted under 35 U.S.C. 154(b) by 633 days.

(21) Appl. No.: 18/169,722

(22) Filed: Feb. 15, 2023

(65) Prior Publication Data

US 2024/0270916 A1 Aug. 15, 2024

(51) Int. Cl.
C08J 9/00 (2006.01)
C08J 9/28 (2006.01)
H10W 20/00 (2026.01)

(52) U.S. Cl.
CPC .............. C08J 9/0061 (2013.01); C08J 9/28 (2013.01); *C08J 2201/0502* (2013.01); *C08J 2205/044* (2013.01); *C08J 2205/10* (2013.01); *C08J 2329/04* (2013.01); *C08J 2377/10* (2013.01); *C08J 2429/04* (2013.01); *C08J 2477/10* (2013.01); *H10W 20/01* (2026.01)

(58) Field of Classification Search
CPC ........................................................ C08J 9/28
See application file for complete search history.

(56) References Cited

U.S. PATENT DOCUMENTS

| | | | | |
|---|---|---|---|---|
| 6,238,837 B1 * | 5/2001 | Fan | ......................... | G03F 7/202 430/944 |
| 2009/0184088 A1 * | 7/2009 | Carlson | .................... | B81B 7/00 216/13 |
| 2019/0085139 A1 * | 3/2019 | Kotov | .................... | B29B 13/06 |
| 2019/0390025 A1 * | 12/2019 | Sakaguchi | ................. | C08J 5/04 |

OTHER PUBLICATIONS

CN110776654 original (Year: 2020).*
CN110776654 translation (Year: 2020).*
CN114633468 original (Year: 2022).*
CN114633468 translation (Year: 2022).*
Zhang, X., Vyatskikh, A., Gao, H. J., Greer, J. R. & Li, X. Y., Lightweight, flaw-tolerant, and ultrastrong nano-architected carbon. PNAS 116, pp. 6665-6672 (2019).

Bauer, J. et al., Nanolattices: An emerging class of mechanical metamaterials. Adv. Mater. 29, 1703343, pp. 1-89 (2017).
Zheng, X. Y. et al., Ultralight, ultra-stiff mechanical metamaterials. Science 344, pp. 1373-1377 (2014).
Zhao, S. Y. et al., Additive manufacturing of silica aerogels. Nature 584, pp. 387-392 (2020).
Danks, A. E., Hall, S. R. & Schnepp, Z., The evolution of 'sol-gel' chemistry as a technique for materials synthesis. Mater. Horiz. 3, pp. 91-112 (2016).
Owens, G. J. et al., Sol-gel based materials for biomedical applications. Prog. Mater. Sci. 77, pp. 1-79 (2016).
Xue, J. J., Wu, T., Dai, Y. Q. & Xia, Y. N., Electrospinning and electrospun nanofibers: Methods, materials, and applications. Chem. Rev. 119, 5298-5415 (2019).
Ding, Y. C., Hou, H. Q., Zhao, Y., Zhu, Z. T. & Fong, H., Electrospun polyimide nanofibers and their applications. Prog. Polym. Sci. 61, pp. 67-103 (2016).
Qian, Z. C., Wang, Z., Zhao, N. & Xu, J., Aerogels derived from polymer nanofibers and their applications. Macromol. Rapid Commun. 39, 1700724, pp. 1-16 (2018).
Zhao, X. H. et al., Soft materials by design: Unconventional polymer networks give extreme properties. Chem. Rev. 121, pp. 4309-4372 (2021).
Zhao, S. Y., Malfait, W. J., Guerrero-Alburquerque, N., Koebel, M. M. & Nystrom, G., Biopolymer aerogels and foams: chemistry, properties, and applications. Angew. Chem. Int Ed. 57, pp. 7580-7608 (2018).
Budtova, T., Cellulose II aerogels: a review. Cellulose 26, pp. 81-121 (2019).
Song, J. W. et al., Highly compressible, anisotropic aerogel with aligned cellulose nanofibers. ACS Nano 12, pp. 140-147 (2018).
Heise, K. et al., Nanocellulose: Recent fundamental advances and emerging biological and biomimicking applications. Adv. Mater. 33, pp. 2004349, pp. 1-30 (2021).
Takeshita, S. et al., Formation of nanofibrous structure in biopolymer aerogel during supercritical CO2 processing: the case of chitosan aerogel, Biomacromolecules 20, pp. 2051-2057 (2019).
Wei, S., Ching, Y. C. & Chuah, C. H., Synthesis of chitosan aerogels as promising carriers for drug delivery: a review. Carbohydr. Polym. 231, 115744, pp. 1-14 (2020).
Duan, B., Huang, Y., Lu, A. & Zhang, L. N., Recent advances in chitin based materials constructed via physical methods. Prog. Polym. Sci. 82, pp. 1-33 (2018).

(Continued)

*Primary Examiner* — Irina Krylova

(74) *Attorney, Agent, or Firm* — Leason Ellis LLP

(57) ABSTRACT

A composite nanofiber aerogel (CNA) is formed from aramid nanofibers (ANFs) combined with polyvinyl alcohol (PVA). These nanoscale constituents of the aerogel form 3D networks with high nodal connectivity and strongly welded connectivity joints between fibrils so that the structure has high stiffness and strength compared to other polymeric aerogels and successive breakage of crosslinks at the connectivity nodes affords energy dissipation while maintaining the overall structural integrity. A specific class of CNA with a specific solid content may be used to form a thin firm with a composite nanofiber framework (CNFF) that is useful in the manufacture of kirigami wearable electronics.

9 Claims, 19 Drawing Sheets
(19 of 19 Drawing Sheet(s) Filed in Color)

(56)      References Cited

OTHER PUBLICATIONS

Qin, Y. Y. et al., Lightweight, super elastic, and mechanically flexible graphene/polyimide nanocomposite foam for strain sensor application. ACS Nano 9, pp. 8933-8941 (2015).

Meador, M. A. B. et al., Mechanically strong, flexible polyimide aerogels crosslinked with aromatic triamine. ACS Appl. Mater. Interfaces 4, pp. 536-544 (2012).

Li, X., Dong, G. Q., Liu, Z. W. & Zhang, X. T., Polyimide aerogel fibers with superior flame resistance, strength, hydrophobicity, and flexibility made via a universal sol-gel confined transition strategy. ACS Nano 15, pp. 4759-4768 (2021).

Chidambareswarapattar, C. et al., Fractal multiscale nanoporous polyurethanes: Flexible to extremely rigid aerogels from multifunctional small molecules. Chem. Mater. 25, pp. 3205-3224 (2013).

Zhou, S. et al., One-pot synthesis of robust superhydrophobic, functionalized graphene/polyurethane sponge for effective continuous oil-water separation. Chem. Eng. J. 302, pp. 155-162 (2016).

Ni, J. H. et al., Strong fatigue-resistant nanofibrous hydrogels inspired by lobster underbelly. Matter 4, pp. 1919-1934 (2021).

Picu, R. C., Mechanics of random fiber networks—a review, Soft Matter 7, pp. 6768-6785 (2011).

Gibson, I. J. & Ashby, M. F., The mechanics of three-dimensional cellular materials, Proc. R. Soc. Lond. A 382, pp. 43-59 (1982).

Zhu, J. et al., Branched aramid nanofibers. Angew. Chem. Int Ed. 56, pp. 11744-11748 (2017).

Xu, L. Z., Zhao, X. L., Xu, C. L. & Kotov, N. A., Water-rich biomimetic composites with abiotic self-organizing nanofiber hetwork, Adv. Mater. 30, 1703343, pp. 1-6 (2018).

Gibson, L. J., Cellular solids, MRS Bull. 28, pp. 270-274 (2003).

Sun, J. Y. et al., Highly stretchable and tough hydrogels, Nature 489, pp. 133-136 (2012).

Broedersz, C. P., Mao, X. M., Lubensky, T. C. & Mackintosh, F. C., Criticality and isostaticity in fibre networks, Nat. Phys. 7, pp. 983-988 (2011).

Wei, X., Zhu, Q., Qian, J., Lin, Y. & Shenoy, V. B., Response of biopolymer networks governed by the physical properties of cross-linking molecules, Soft Matter 12, pp. 2537-2541 (2016).

Chaudhuri, O., Cooper-White, J., Janmey, P. A., Mooney, D. J. & Shenoy, V. B., Effects of extracellular matrix viscoelasticity on cellular behaviour, Nature 584, pp. 535-546 (2020).

Sharma, A. et al., Strain-controlled criticality governs the nonlinear mechanics of fibre networks., Nat. Phys. 12, pp. 584-587 (2016).

Hisu, P. C. et al., Radiative human body cooling by nanoporous polyethylene textile, Science 353, pp. 1019-1023 (2016).

Sun, T. L. et al., Physical hydrogels composed of polyampholytes demonstrate high toughness and viscoelasticity, Nat. Mater. 12, pp. 932-937 (2013).

Crisfield, M., A. Non-linear finite element analysis of solids and structures Ch17, (John Wiley & Sons, New York, 1997).

Z. Huang, Y. Hao, et al., Three-dimensional integrated stretchable electronics , Nature Electronics, 2018, 1, pp. 473-480.

Y. Dai, et al., Stretchable transistors and functional circuits for human-integrated electronics, Nature Electronics. 2021, 1, pp. 17-29.

N. Matsuhisa, X. Chen, Z. Bao, T. Someya, Materials and structural designs of stretchable conductors, Chem. Soc. Rev. 2019, 48, pp. 2946-2966.

D. C. Kim, H. J. Shim, W. Lee, J. H. Koo, D. H. Kim, Material-Based Approaches for the Fabrication of Stretchable Electronics, Adv. Mater., 2020, 32, 1902743, pp. 1-29.

Y. Wang, et al., A highly stretchable, transparent, and conductive polymer, Sci. Adv,. 2017, 3, e1602076, pp. 1-10.

S. Choi, et al., Highly conductive, stretchable and biocompatible Ag—Au core-sheath nanowire composite for wearable and implantable bioelectronics Nat. Nanotechnol. 2018, 13, pp. 1048-1056.

C. Wang, et al., Materials and Structures toward Soft Electronics, Adv. Mater. 2018, 30, 1801368, pp. 1-49.

J. A. Fan, et al, Fractal design concepts for stretchable electronics, Nat. Commun. 2014, 5-3266, pp. 1-8.

Y. Wang, et al., Electrically compensated, tattoo-like electrodes for epidermal electrophysiology at scale, Sci. Adv. 2020, 6, eabd0996, pp. 1-13.

L. Xu, et al., 3D multifunctional integumentary membranes for spatiotemporal cardiac measurements and stimulation across the entire epicardium, Nat. Commun. 2014, 5, 3329, pp. 1-18.

S. Han, et al., Mechanically Reinforced Skin-Electronics with Networked Nanocomposite Elastomer, Adv. Mater. 2016, 28, pp. 10257-10265.

Y. Xu, et al., Multiscale porous elastomer substrates for multifunctional on-skin electronics with passive-cooling capabilities, Proc. Natl. Acad. Sci. U. S. A. 2020, 117, pp. 205-213.

L. Tian, et al, Large-area MRI-compatible epidermal electronic interfaces for prosthetic control and cognitive monitoring, Nat. Biomed. Eng. 2019, 3, pp. 194-205.

Z. Li, et al., All-Fiber Structured Electronic Skin with High Elasticity and Breathability, Adv. Funct. Mater. 2019, 30, 1908411, pp. 1-9.

Y. Zhang, et al., A New Class of Electronic Devices Based on Flexible Porous Substrates, Adv. Sci. 2022, 2105084, pp. 1-39.

D.-H. Kim, et al., Dissolvable Films of Silk Fibroin for Ultrathin, Conformal Bio-Integrated Electronics, Nat. Mater. 2010, 9, pp. 511-517.

S. Liu, et al., Strategies for body-conformable electronics, Matter 2022, 5, pp. 1104-1136.

M. K. Blees, et al., Graphene kirigami, Nature 2015, 524, pp. 204-212.

T. C. Shyu, et al., A kirigami approach to engineering elasticity in nanocomposites through patterned defects, Nat. Mater. 2015, 14, pp. 785-790.

Y. Morikawa, et al., Ultrastretchable Kirigami Bioprobes, Adv. Healthc. Mater. 2018, 7, 1701100, pp. 1-10.

A. Lamoureux, et al., Dynamic kirigami structures for integrated solar tracking, Nat. Commun. 2015, 6, 7373., pp. 1-6.

K. Yong, et al., Kirigami-inspired strain-insensitive sensors based on atomically-thin materials, Mater. Today 2019, pp. 1-8.

L. Xu, et al, Origami and Kirigami Nanocomposites, ACS Nano 2017, 11, pp. 7587-7599.

H. Li, et al., 3D Interfacing between Soft Electronic Tools and Complex Biological Tissues, Adv. Mater. 2020, 33, 2004425, pp. 1-17.

R. Zhao, et al., Kirigami enhances film adhesion, Soft Matter 2018, 14, pp. 2515-2525.

A. Das, et al., Fracture in Microscale SU-8 Polymer Thin Films, Exp. Mech. 2017, 57, pp. 687-701.

R. Ballarini, et al., The fracture toughness of polysilicon microdevices: A first report, J. Mater. Res. 1997, 12, pp. 915-922.

M. Pharr, et al., Measurements of the Fracture Energy of Lithiated Silicon Electrodes of Li-Ion Batteries, Nano Lett. 2013, 13, pp. 5570-5577.

J. Lyu, et al., High Strength Conductive Composites with Plasmonic Nanoparticles Aligned on Aramid Nanofibers, Adv. Funct. Mater. 2016, 26, pp. 8435-8445.

H. Li, et al., Breathable and Skin-Conformal Electronics with Hybrid Integration of Microfabricated Multifunctional Sensors and Kirigami-Structured Nanofibrous Substrates, Adv. Funct. Mater. 2022, 2202792, pp. 1-8.

Crisfield, M. A., Non-linear finite element analysis of solids and structures. Ch7, John Wiley & Sons, New York, 1997, 509 pages.

* cited by examiner

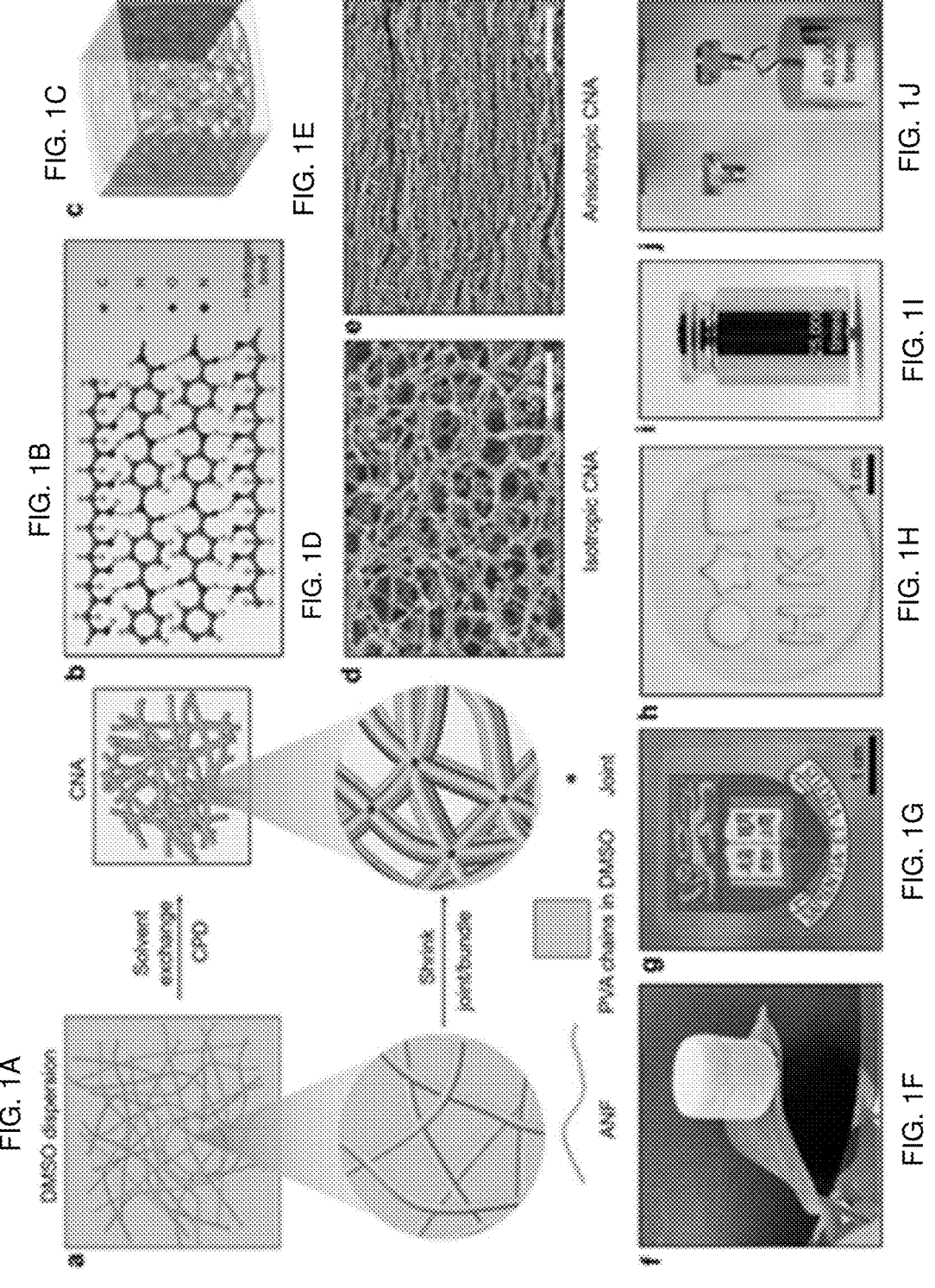

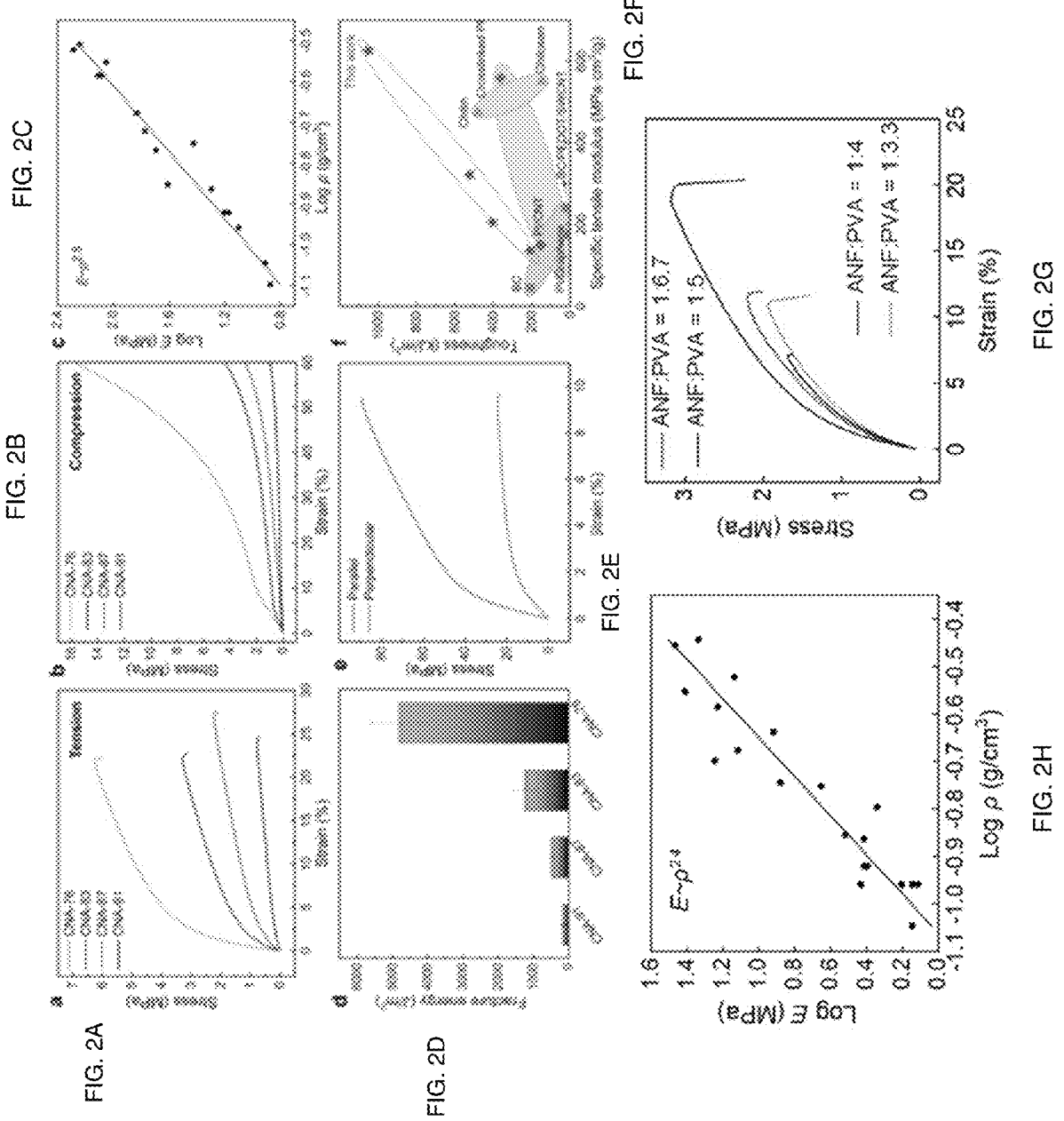

FIG.18A          FIG.18B
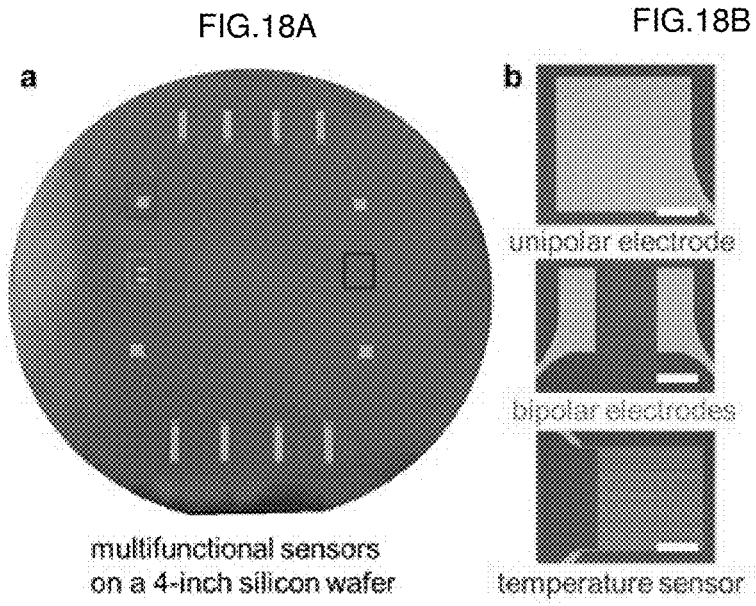
multifunctional sensors
on a 4-inch silicon wafer
unipolar electrode
bipolar electrodes
temperature sensor
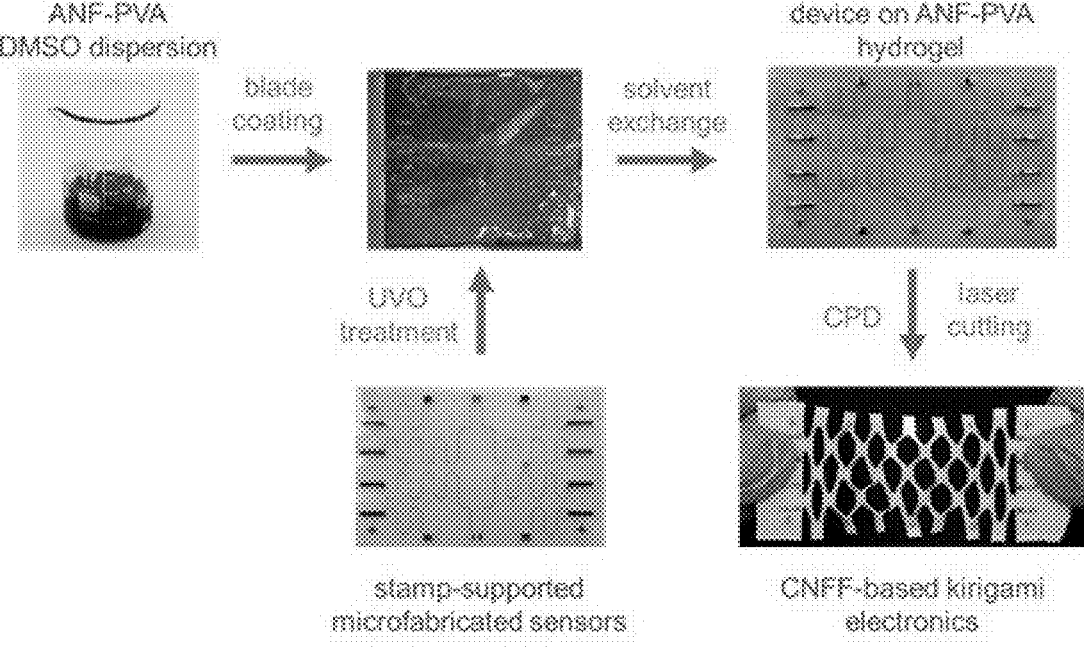
FIG. 19

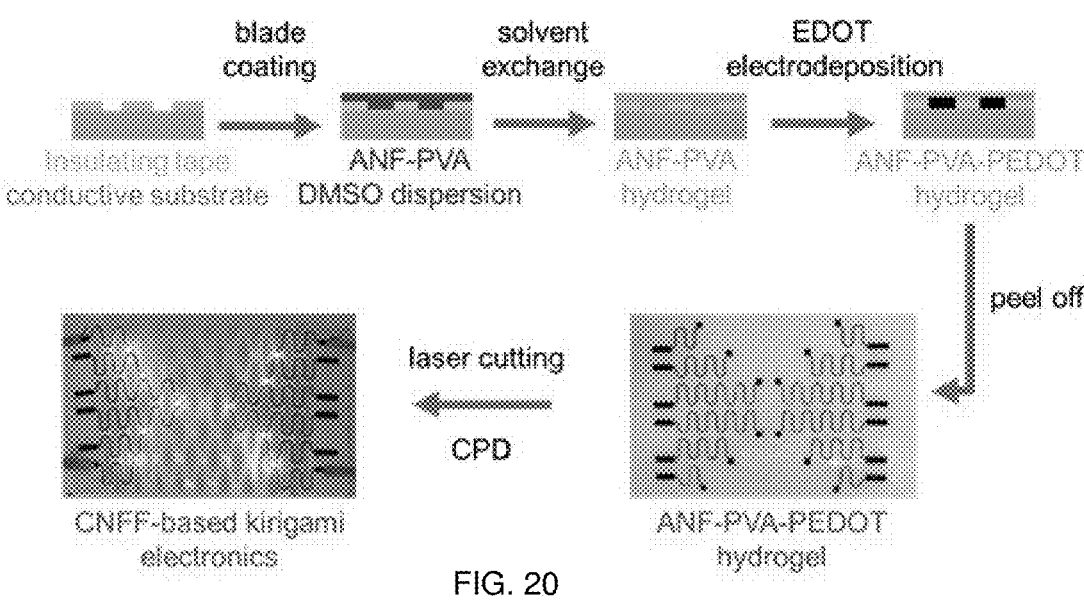
FIG. 20
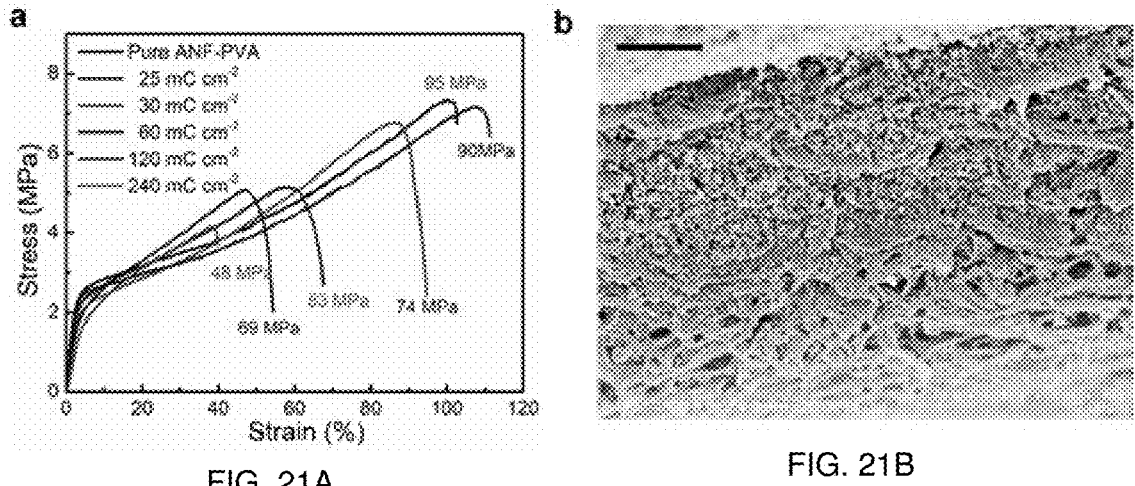
FIG. 21A
FIG. 21B
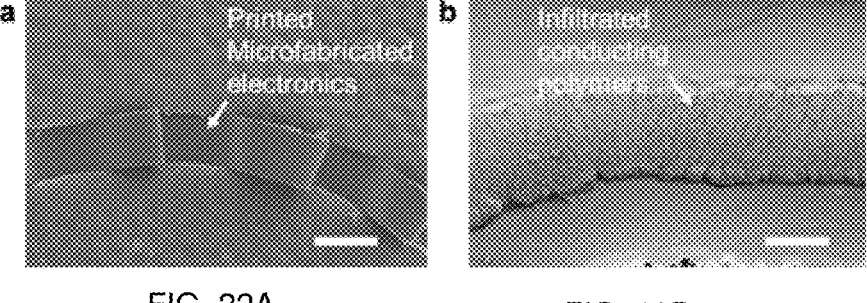
FIG. 22A
FIG. 22B

FIG. 25A           FIG. 25B
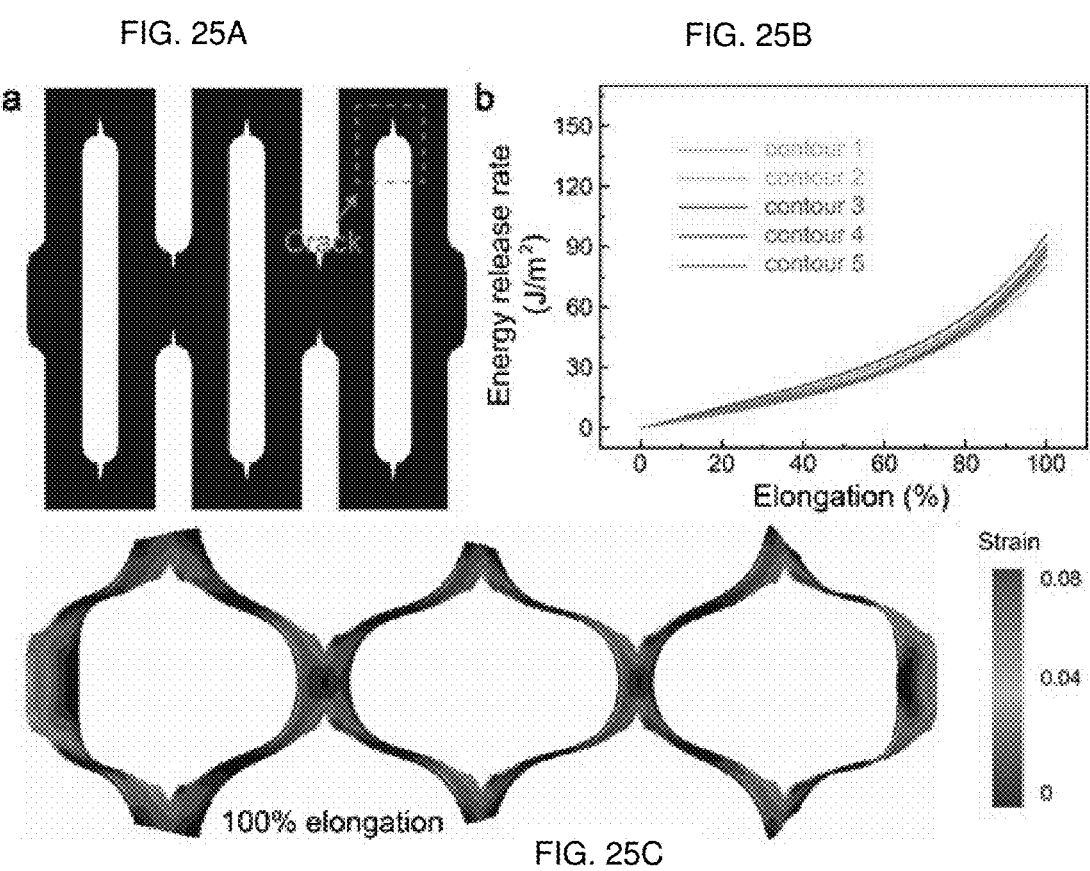
FIG. 25C
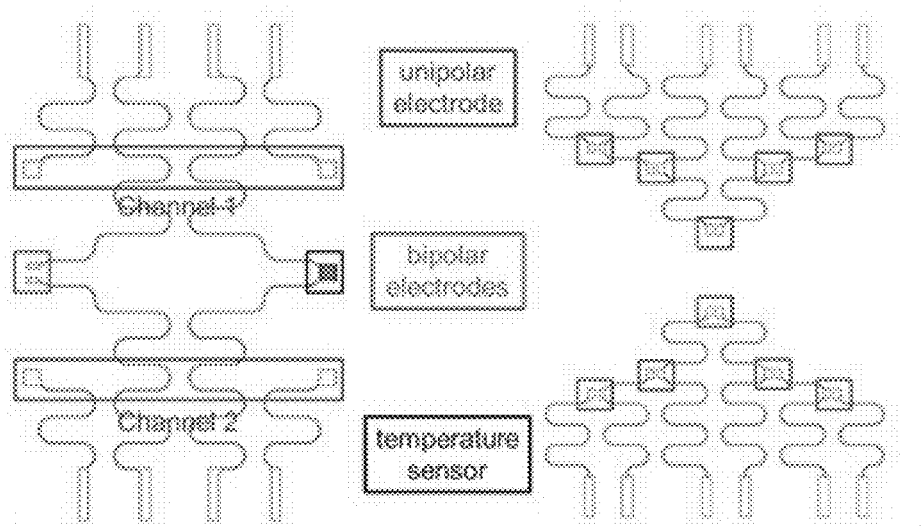
Design for transfer printed sensors     Design for conducting polymer electrodes
FIG. 26

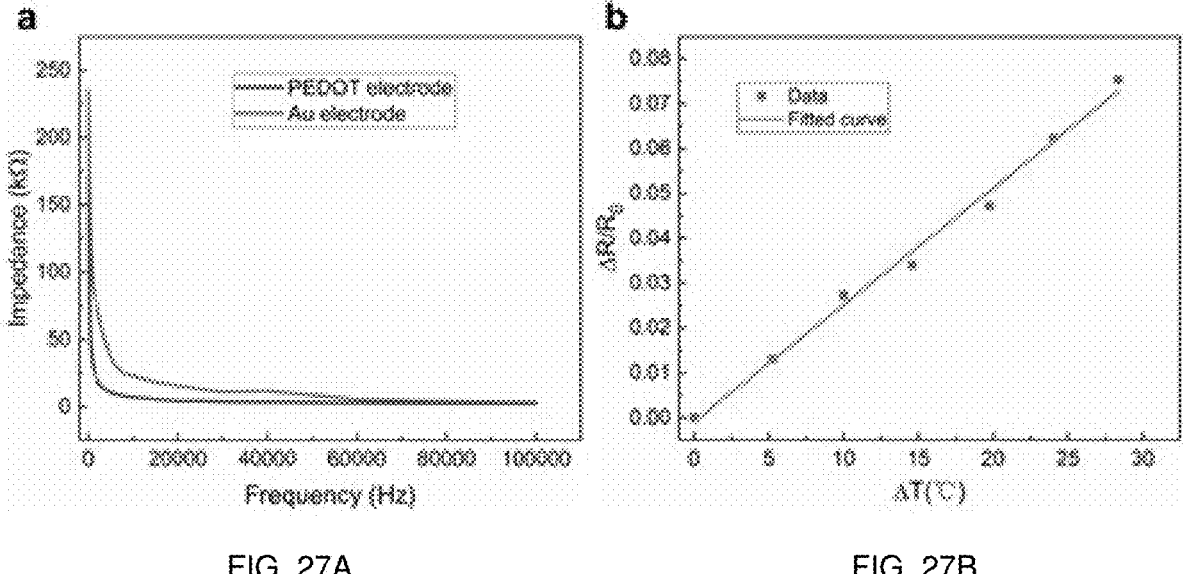
FIG. 27A                                        FIG. 27B

ULTRASTRONG AEROGELS BASED ON ARAMID NANOFIBER COMPOSITES AND MEMBRANE DEVICES MADE THEREFROM

FIELD OF THE INVENTION

The present invention relates to ultra strong polymeric aerogels (or nanofoams) based on aramid nanofiber composites and, in particular, to techniques for using such aerogel membranes to create Kirigami-inspired structural patterns for stretchable electronics.

BACKGROUND OF THE INVENTION

Traditional aerogels are weak and brittle. They cannot achieve high mechanical strength and toughness without sacrificing porosity.

Porous networks assembled from fibrillar elements represent an efficient structural design for materials. Nature exploited such design for the building of a variety of load-bearing biological tissues. As exemplified by the microstructures of cartilage, trabeculated bones, and plant tissues, these three-dimensional (3D) microfibrillar networks afford a combination of physical strength, lightweight, mass permeability, and surface functionality. Although extensive efforts have been devoted to the engineering of lightweight materials having a 3D microfibrillar network, approaches to high mechanical strength and scalable fabrication are still limited. For example, metamaterials created from stereolithographic patterning allow rational design for desired mechanical properties [1-3], but the required structural ordering creates challenges for large-scale production. Aerogels prepared by sol-gel processes exhibit high stiffness originating from the ceramic constituents, but their intrinsic brittleness may limit their application under macroscopic deformation. [4-6]

Electrospinning techniques were adopted for creating flexible polymeric membranes involving nanofibers [7,8]. However, it is difficult to design microscale topology or fabricate 3D structures with this method. Recently, aerogels or foams from self-assembled polymeric nanofibers have drawn wide attention due to their structural similarity to biological tissues. [9] Nevertheless, achieving a high mechanical strength with currently available chemistries remains difficult due to the weak interactions among fibrils [10].

Indeed, a range of biomacromolecules including cellulose [11-14] and chitin [15-17], or synthetic polymers such as polyimide (PI) [18-20] and polyurethane (PU) [21,22], were explored for the creation of nanofoams or those referred to as aerogels. Although most of them can form 3D microfibrillar networks, their achievable mechanical strengths vary drastically by a few orders of magnitude (e.g., from $10^{-2}$ MPa to $10^1$ MPa) even with similar levels of solid content. It is conceivable that distinct chemical crosslinking between fibrils may affect mechanical properties of the network. [23] However, quantitative relationships between the various microstructural factors and macroscopic mechanical responses remain elusive. Furthermore, the randomness of fibrillar networks creates difficulties for accurate theoretical estimation based purely on Maxwell rigidity theory [24] or Gibson-Ashby models for cellular solids [25].

U.S. Pat. No. 11,111,343 discloses a method of fabricating pure aramid nanofiber (ANF) gels using composite aerogels involving both ANF and polyvinyl alcohol (PVA). These have much higher mechanical properties than typical.

The article "Gas-Permeable, Multifunctional On-Skin Electronics Based on Laser-Induced Porous Graphene and Sugar-Templated Elastomer Sponges," describes devices based on elastomer foams with laser-scribed graphene as the conductive elements.

In another domain, emerging flexible electronic devices are mostly based on non-permeable polymer films. Stretchable electronics are useful for the construction of smart wearable systems due to their mechanical compatibility with dynamic surfaces of the human body. [38-41] Although a variety of materials and structural designs have been exploited for the fabrication of stretchable electronics, achieving high mechanical robustness with desired functionality for wearable applications remains challenging. For instance, conjugated polymers and soft composites exhibit considerable electrical conductance even under severe deformation, [42-44] but fabrication of multifunctional polymer devices with stress-invariant electronic properties is difficult. Filamentary serpentine meshes with inorganic components combine excellent electronic performance and good stretchability, [45, 46] but their delicate structures are prone to mechanical damage. Transfer printing of serpentine electronics onto elastomer films could enhance their overall structural robustness. [47, 48] However, the dense polymer substrate may hinder water and vapor transport arising from biological tissues, causing potential issues for wearable applications. [49-52] In addition, poor conformability of dense films on non-developable 3D surfaces is another limitation. [53, 54]

Kirigami-inspired structures have recently emerged as promising candidates for stretchable electronics. [55-60] In kirigami devices, a pattern of cuts is introduced into solid membranes, which allows the whole structure to accommodate imposed macroscopic elongation via mesoscale bending and twisting. Furthermore, kirigami membranes are capable of large-area integration on 3D dynamic surfaces, [61, 62] providing a conformal platform. Three-dimensional microfibrillar networks represent an important structural design for various natural tissues and synthetic aerogels. Despite extensive efforts, achieving high mechanical properties for synthetic 3D microfibrillar networks remains challenging for wearable human-machine interfaces.

Further, designing robust and multifunctional Kirigami electronics for wearable applications imposes strict restrictions on the constituent materials. First, the cuts involved in kirigami patterning inevitably lead to stress concentration in the materials under stretching, potentially causing failure of the device by crack propagation. Therefore, many electronic materials with a brittle nature may not be suitable for creating kirigami membranes with high stretchability. A careful evaluation regarding the stretchable design and intrinsic toughness of the base materials becomes essential. Second, fabrication methods must be developed for reliable integration of diverse functional electronic components onto the base membrane. In this regard, an ideal material platform should be compatible with both the transferred inorganic microelectronics and conductive composites involving soft polymers, along with their distinct processing techniques. Third, microstructural permeability of the membrane is desired, which combines with the mesoscale openings from kirigami cuts to provide breathability of the device for wearable applications.

Exploring novel porous materials as the substrates for flexible electronics would greatly enhance their functionality.

SUMMARY OF THE INVENTION

The present invention is directed to composite nanofiber aerogels (CNAs) from aramid nanofibers (ANFs) with outstanding mechanical properties. The unique interactions between nanoscale constituents lead to assembled 3D networks with high nodal connectivity and strong welded connections between fibrils. These features lead to unusually high stiffness and strength of CNAs, which is confirmed by theoretical simulation of 3D fibrillar networks. On the other hand, successive breakage of crosslinks at high connectivity nodes affords energy dissipation while maintaining the overall structural integrity. As a result, the fracture toughness of CNAs (~4,700 $Jm^{-2}$) could be orders of magnitude higher than many existing aerogels. Furthermore, CNAs can be fabricated into various 3D configurations with simple processing steps, indicating their potential applications in wearable devices and membrane technologies. The mechanistic insights provided by these ultra strong polymeric aerogels may create a range of opportunities for materials design and technological innovation.

The invention particularly relates to novel aerogel materials based on aramid nanofibers (ANFs) combined with polyvinyl alcohol (PVA). The processing techniques allow assembly of highly connected composite nanofiber network with high-strength fibrillar joints.

The invention further relates to the development of techniques for the fabrication of permeable membrane devices with highly stretchable kirigami structures and integrated electronic components for wearable systems. In particular, the present invention provides a versatile materials in the form of a CNA platform for the construction of wearable kirigami electronics with high mechanical robustness and multifunctionality (FIG. 5A). A central piece in this platform is a microporous framework based on aramid nanofiber (ANF) composites. [26, 27] The self-assembled hyper-connective fibrillar network exhibits high toughness to withstand stress concentration around kirigami cuts, allowing flexible design for stretchability without causing failure of the device by crack propagation. The solution-based processing steps for fabricating microporous kirigami membranes make their integration with various integrated electronic components, including transfer-printed inorganic microelectronics and infiltrated conducting polymers, very feasible (FIGS. 5C and 5D). In these figures the scale bars equal 10 mm. The multifunctional kirigami electronics are compatible with 3D surfaces of the skin, enabling physiological sensing of electrocardiogram (ECG), electromyogram (EMG), skin temperature, and potentially other important parameters. These robust, multifunctional, and biocompatible kirigami devices may provide insights for the design of advanced stretchable electronics and wearable systems.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

The foregoing and other objects and advantages of the present invention will become more apparent when considered in connection with the following detailed description and appended drawings in which like designations denote like elements in the various views, and wherein:

FIG. 1A shows schematics of the assembly process of composite nanofiber aerogels (CAN), FIG. 1B shows a schematic of intermolecular interactions between ANF and PVA involved in CNAs, FIG. 1C shows a schematic of CNA involving bundling and jointing of fibrils in the 3D network, FIG. 1D is an SEM image of an isotropic CNA, FIG. 1E is an SEM image of a highly oriented anisotropic CNA, FIG. 1F is a photograph of a bulk CNA sample with a density of 0.02 g $cm^{-3}$, FIG. 1G is a photograph of a CNA membrane with semitransparency, FIG. 1H is a CNA sample patterned by infrared laser machining, FIG. 1I is a photograph of CNA samples under compression and FIG. 1J is a photograph of CNA samples under tension;

FIG. 2A shows a graph of tensile responses of CNAs with their porosity ranging from 76% to 91%, FIG. 2B shows compressive stress-strain curves of CNAs with various porosity levels, FIG. 2C is a graph of tensile moduli of CNAs as a function of their density, obtained from experimental characterization and theoretical fitting, FIG. 2D is a bar graph of the fracture energies of CNAs as a function of their porosity, FIG. 2E shows graphs of anisotropic tensile responses of a CNA sample with highly oriented fibrils, measured from the directions parallel and perpendicular to the fibril orientation, respectively, FIG. 2F shows plots of toughness and specific tensile modulus of CNAs, as compared with other polymeric aerogels with high mechanical properties, FIG. 2G shows graphs of the effects of an ANF-PVA mixing ratio on the tensile properties of CNAs and FIG. 2H illustrates the compressive modulus of CNAs as a function of density;

FIG. 7 shows schematics of the fabrication processes for CNFF-based kirigami electronics where FIG. 7A shows transferring methods for wafer-fabricated multifunctional electronics, FIG. 7B shows electrodeposition processes for the integration of conducting polymers and FIG. 7C shows laser cutting and critical point drying steps to complete the fabrication of CNFF-based kirigami electronics;

FIG. 8 shows the behaviors of CNFF-based kirigami devices for wearable applications where

FIG. 9 shows multimodal physiological sensing with CNFF-based kirigami electronics wherein

FIG. 15A illustrates finite element analysis (FEA) simulation of CNFF-based kirigami membranes with details of a crack (left) and the contours for J-integral (right), FIG. 15B shows a design with wider cuts (left) leading to similar levels of energy release rate under elongation (right) along with a graph of elongation versus energy and FIG. 15C shows strain distribution in the structures shown in FIG. 15B under 100% elongation;

FIG. 17 is a diagram of the formation of microfabricated sensors with multi-layers wherein

FIG. 18A is an image of a multifunctional electronics wafer-fabricated sensor on a 4-inch silicon wafer including unipolar electrodes, bipolar electrodes and a temperature sensor and FIG. 18B shows magnified images of the electrodes obtained from an optical microscope;

FIG. 19 shows a fabrication process for creating printed multifunctional electronics;

FIG. 20 shows a fabrication process for creating conducting polymer structures;

FIG. 21A shows tensile stress-stain curves of PEDOT-infiltrated CNFF membranes without patterns and with various PEDOT contents controlled by the total charge transferred during electrodeposition and FIG. 21B is a cross-sectional SEM image showing the PEDOT infiltrated into the CNFF;

FIG. 22A is an SEM image of the serpentine interconnects for printed microfabricated electronics based on thin-film metals and FIG. 22B is an SEM image of infiltrated PEDOT;

FIG. 25A shows the geometry of the sample in FIG. 23A in the FEA simulation on cracked samples, FIG. 25B shows the energy release rate for crack propagation as a function of elongation imposed on the membrane and FIG. 25C shows the strain distribution in the sample under 100% elongation;

FIG. 26 shows the design of electronic components wherein on the left are wafer-fabricated sensors and on the right are conducting polymer electrodes; and FIG. 27A shows the characterization of sensors for skin impedances measured with PEDOT electrodes and Au electrodes and FIG. 27B shows the calibration of a temperature sensor.

DETAILED DESCRIPTION OF THE INVENTION

Figures 3A, 3B, 3C, 3D, 3E, 3F, 3G, 3H, 3I, 3J:
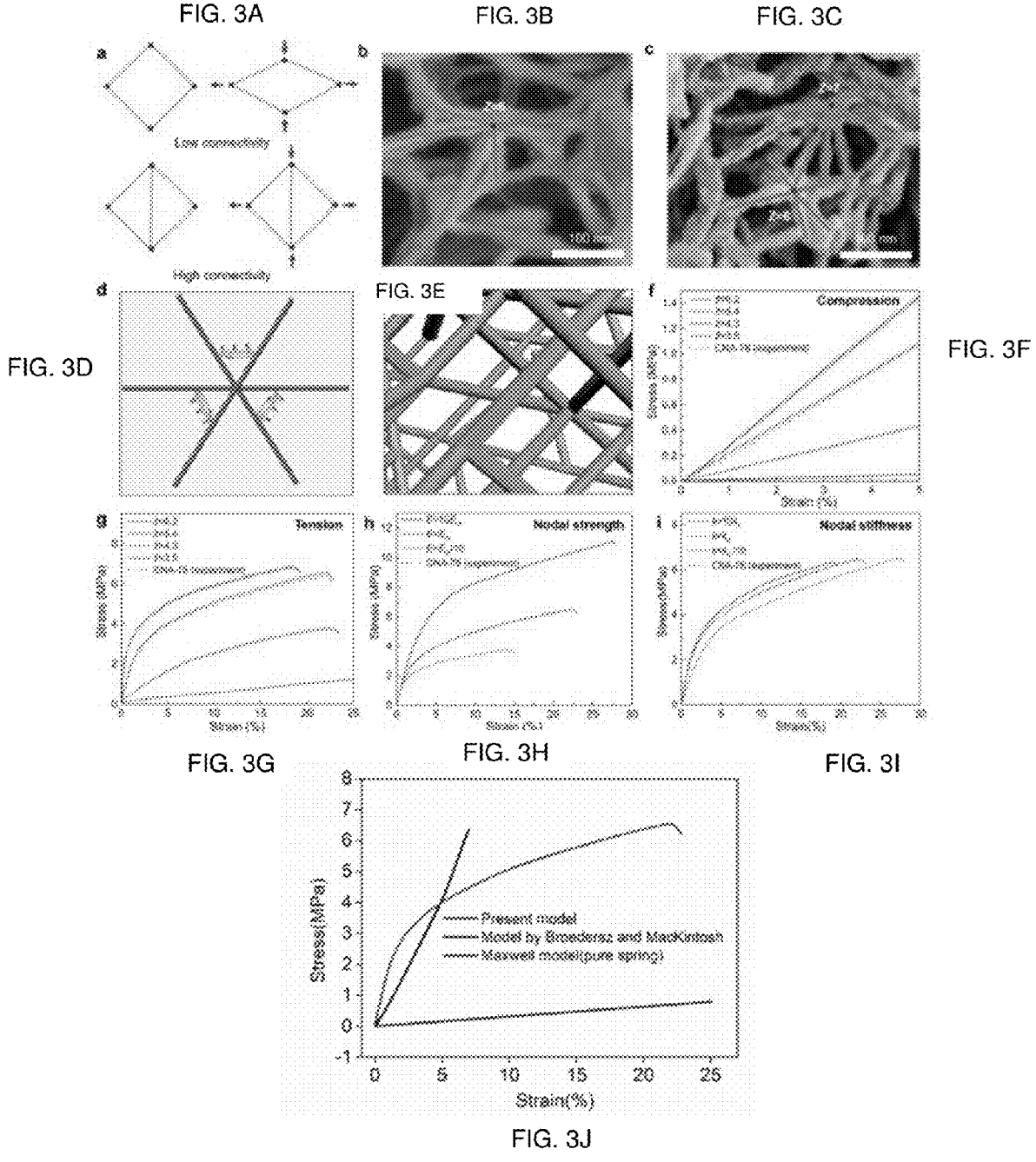
FIG. 3A shows examples of pin-jointed truss networks illustrating the distinct rigidity levels originating from different nodal connectivity.
FIGS. 3B and 3C are SEM images of CNAs showing a random 3D network with high-connectivity nodes.
FIG. 3D is a schematic model of a CNA with linear and rotational springs connecting each pair of crosslinked fibrils.
FIG. 3E is an illustration of a 3D network representing a CNA with an average nodal connectivity of z=5:4.
FIG. 3F is a graph of the effects of average nodal connectivity on the compressive responses of the simulated random 3D networks, FIG. 3G a graph of the effects of average nodal connectivity on the tensile responses of the simulated random 3D networks.
FIG. 3H is a graph of the effects of nodal strength represented by the binding energy, E (h), and nodal stiffness represented by the spring constant, ks.
FIG. 3I is a graph of the effects of the crosslinkers on the tensile responses of simulated 3D networks with an average nodal connectivity of z=5:4
FIG. 3J is a depiction of predicted tensile stress-strain responses of a fibrillar network (with connectivity z=5.4) according to different models.

Formation of the composites according to the present invention involves a dispersion of aramid nanofibers (ANFs) in dimethyl sulfoxide (DMSO) mixed with dissolved polyvinyl alcohol (PVA). After solvent exchange with ethanol followed by critical point drying (CPD), a solid foam with nanoscale porosity will form (FIG. 1A), which can be referred to as an "aerogel" for comparison with other polymeric counterparts. ANFs exhibit intrinsic branching, which is conducive to a high connectivity of the assembled network [26]. Furthermore, the extensive hydrogen bonding between the ANFs and PVA (FIG. 1B) may lead to several unique microstructural features of the resulted aerogels [27]. First, the attraction between ANFs and the surrounding PVA chains may influence the topology of the assembled network during the shrinking and drying process, leading to bundling and jointing of fibrils in a 3D network (FIG. 1A and FIG. 1C). Such a process may generate nodes connected to more than four neighboring nodes, which is otherwise difficult to achieve with random placement of linear fibers. Second, the solid PVA in the aerogel can conform to the nanofiber network, providing welded nodes with high mechanical strength as shown in FIG. 1A. Third, the reconfiguration of the hydrogen bonding may afford stress-induced orientation of nanofibers, allowing for fabrication of aerogels with desired anisotropy. All of these features are observable by the scanning electron microscopy (SEM) examination. Indeed, cross-sectional images of CNAs show fibrillar networks with nodes connected to five or more neighbors (FIG. 1D), even though the 2D image of a cross section may underestimate a node's out-of-plane connections. Furthermore, the nanofibers appear to be continuous across the nodes, indicating welding by the shrunk PVA chains. Markedly, these microstructural features are also evident in a few other polymeric aerogels with high mechanical strengths, e.g., those from polyimide PI. [19,20] On the other hand, the reconfigurability of ANF-PVA interaction imparts a unique route for the anisotropic assembly of nanofibers (FIG. 1E).

The simplicity of the processing steps affords fabrication of aerogels into various configurations. The liquid precursor can be casted into 3D molds to yield bulk aerogel samples (FIG. 1F). Alternatively, it can be spin-coated or doctor-bladed to generate aerogel films (thickness of 60 μm) with semi-transparency (FIG. 1G). Ablation with common infrared lasers allows precise machining of aerogel samples at millimeter scale (FIG. 1H). These aerogels exhibit remarkable properties under loading, as exemplified by high stiffness and strength under both compression (FIG. 1I) and tension (FIG. 1J). The samples can bear mechanical loads 25,000 times (compression) and 40,000 times (tension) higher than their own weights without fracture or severe distortion.

Mechanical characterization quantifies the properties of CNAs with various solid contents. Porosity of the CNAs is adjusted by tuning of the concentration of their liquid precursor, with an optimized mass ratio between ANFs and PVA at 1:5 (FIG. 2G). In FIG. 2G the samples have a fixed porosity of ~83%. An optimized mass ratio of 1:5 between ANF and PVA was identified for both high modulus and strength. Tensile moduli and strengths of CNAs both increase with decreasing porosity, with a high modulus of 187.6 MPa and strength of 6.3 MPa achieved at 76% of porosity, which is referred to as "CNA-76" (FIG. 2A). Interestingly, the ultimate tensile strains of CNAs with various porosities remain within a relatively small range from 22.2% to 27.4%, indicating a common topology and failure mechanism for CNAs. The tensile responses of existing aerogels are not widely reported due to their limited stretchability. In this regard, the high tensile modulus and strength of CNAs, in conjunction with their considerable ductility, may make them advantageous for structural applications. The compression behaviors of CNAs with various porosities follow a similar trend (FIG. 2B and FIG. 2H). In FIG. 2H the function follows a typical power law for aerogel materials and compares favorably with that for tension (FIG. 2C). However, CNA-76 exhibits a distinct linear regime at the beginning of compression with the strain below ~9%, followed by a softening stage and then ultimately strain hardening at very large compressive strain. The softening behavior is attributed to the buckling of fibrillar segments. Since CNA-76 involves a lower porosity than other samples, its fibrillar segments between nodes are shorter and can withstand a larger compressive load before buckling. In contrast, CNAs with higher porosity may experience fibril buckling at a lower compressive load, leading to an earlier onset of softening. Finally, the strain hardening of CNAs under large compressive deformation is likely due to the densification of fibrils.

Figures 10A, 10B, 10C, 11A, 11B, 11C:
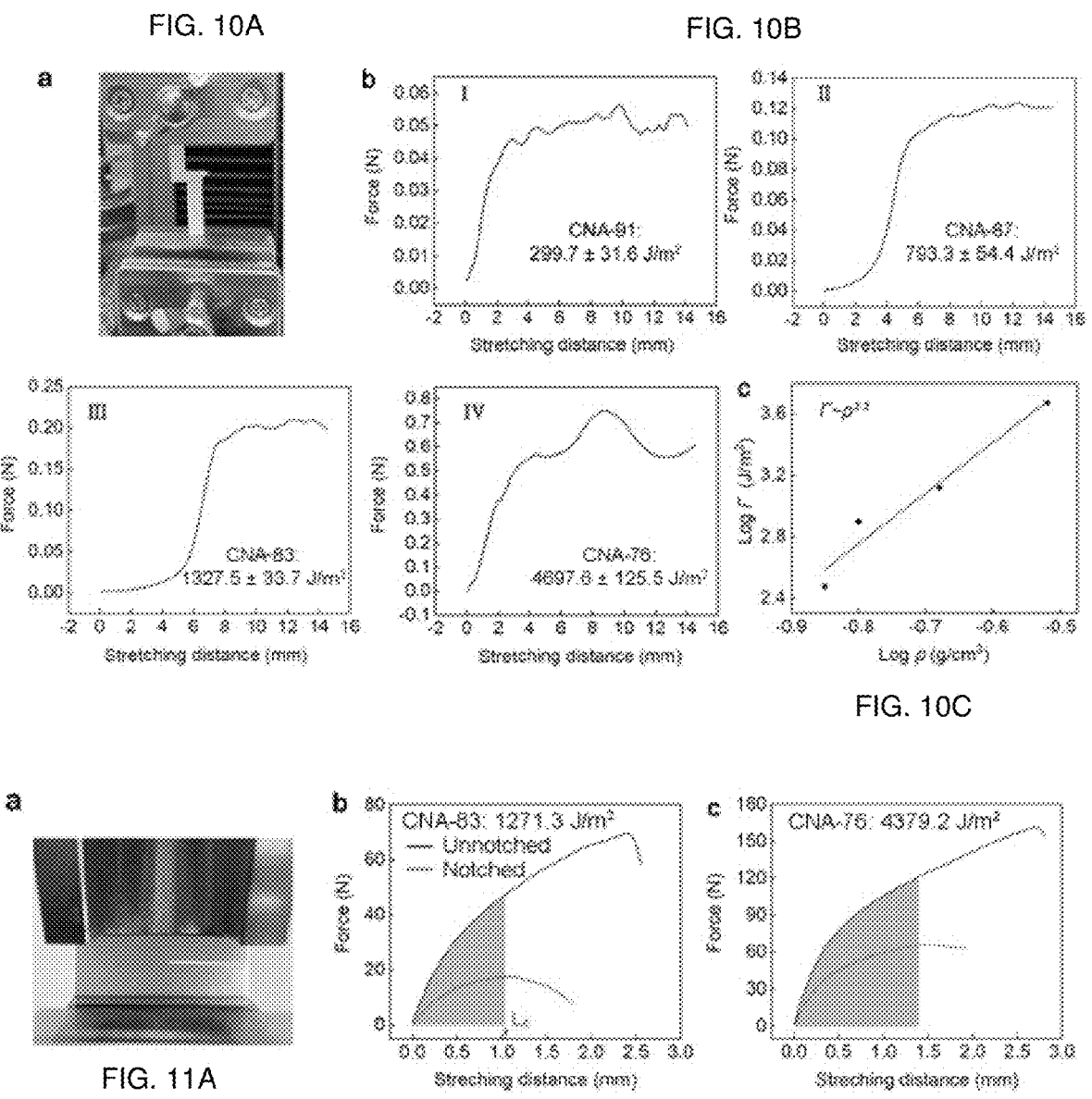
FIG. 10A is a photo of a setup for tear testing.
FIG. 10B is a set of graphs of the fracture energies of CNAs characterized by tearing tests in the form of force-extension curves and the calculated tearing energies for CNA 91 (I), CNA 87 (II), CNA 83 (III) and CNA 76 (IV)
FIG. 10C is a logarithmic plot of the fracture energy as a function of density.
FIG. 11A is a photo of a setup for shear tests.
FIG. 11B is a force extension curve for notched and unnotched samples, as well as the calculated fracture energy for CNA 83.
FIG. 11C is the force extension curve for CNA 76.

Tensile moduli of CNAs as a function of their solid contents follow a relation $E \sim p^{2.5}$, where E and p are the Young's modulus and density, respectively (FIG. 2C). This relationship is typical for foam materials with random internal structures [28]. Their fracture energy also increases with increasing solid content, following a typical trend for foams (FIG. 2D, FIG. 10 and FIG. 11). The high fracture energy of CNA-76 (~4697.6 Jm-2) exceeds those of many engineering polymers and is actually comparable to the fracture energies of natural rubbers [29]. The toughness of CNAs may arise from successive breakage of connections between fibrils, as well as their re-orientation and relative sliding under imposed deformation [27]. Indeed, the characteristics of isotropic CNAs are distinguishable from those of other polymeric aerogels known for their high mechanical properties (FIG. 2F). In FIG. 2F the toughness was calculated by integrating the tensile stress-strain curves from various materials (Table 1).

TABLE 1

Parameters of CNAs as compared with other polymeric aerogels with high mechanical properties.

| | Density (g/cm³) | Tensile modulus (MPa) | Specific tensile modulus (MPa · cm³/g) | Toughness (kJ/m³) | Ref. |
|---|---|---|---|---|---|
| Crosslinked Polyimide (PI) | 0.3 | 167.5 | 558.3 | 362.3 | 4 |
| PI/Graphene | 0.01 | 1.7 | 173.8 | 9 | 5 |
| PI/CNT | 0.4 | 59.8 | 149.5 | 152.8 | 6 |
| Bacterial Cellulose (BC) | 0.32 | 14.5 | 45.2 | 207.4 | 7 |
| BC/PEDOT/ SWCNT | 0.35 | 84 | 240 | 22.7 | 8 |
| Chitin | 0.17 | 80.5 | 473.5 | 480.7 | 9 |
| Chitosan | / | / | 550.6 | 147.6 | 10 |
| CNA-89 | 0.14 | 19.1 | 136.4 | 212 | This |
| CNA-87 | 0.16 | 32.9 | 205.6 | 406 | work |
| CNA-83 | 0.21 | 67.6 | 321.9 | 523 | |
| CNA-76 | 0.30 | 187.6 | 625.3 | 1050.6 | |

Furthermore, anisotropic porous composites can be obtained from stress-induced alignment of the nanofiber network during processing. For samples with a porosity of 48.7%, the tensile modulus and tensile strength along the orientation of the fibrils can reach 4.3 GPa and 89.3 MPa, respectively (FIG. 1E and FIG. 2E). These parameters are ~4.2 and 3.7 times higher than the properties measured along the directions perpendicular to the aligned fibrils.

A unique feature of CNAs is that many fibrils are connected and welded at their common joints (FIGS. 3B and 3C), leading to a high nodal connectivity in contrast to networks from random placement of linear fibrils. The connectivity and nodal mechanics of random 3D networks can be investigated with respect to their influence on the macroscopic properties of the material. To illustrate the physical pictures, it is worthwhile reviewing some of the established models for the mechanics of network structures. In Maxwell rigidity theory, a pin-jointed truss network will exhibit a finite stiffness only if its connectivity reaches a threshold value of 2d, with d being the dimension of the problem. [30] Below the threshold, free rotation of the trusses will accommodate the deformation, leading to a lack of network stiffness (FIG. 3A). On the other hand, once the connectivity exceeds the critical value, the network behavior changes from fluid- to solid-like. Recent papers have indicated that the threshold connectivity will decrease if bending rigidity of individual fibrils is considered. [30] These models highlight the significance of nodal connectivity for the mechanics of fibrillar networks. However, they do not replicate the observed response of CNAs (FIG. 3J) because several important factors were not fully considered. In FIG. 3J each fibril was treated as a linear spring (i.e., having negligible bending rigidity) in the Maxwell model. In this case the resistance of the network against imposed deformation is very small, which is consistent with the fact that the connectivity here is below the threshold level of z=6 (for a network to exhibit non-vanishing bulk modulus) predicted by the Maxwell theory. The bending rigidity of the fibrils was taken into account in the model by Broedersz and Mackintosh, but connected fibrils were allowed to freely rotate with respect to each other (i.e. the fibrils are hinged together). Notice that, in this case the network exhibits no strain-softening because crosslinker breakage was not considered. FIG. 3J the red line corresponds to results from the present model. First, fibrillar joints may exhibit resistance to rotation, providing a significant contribution to the overall rigidity. Second, the breakage of fibrillar joints should play a major role in the mechanical responses under high deformation, which was not included in conventional models. Third, the random nature of fibrils and nodes in the 3D network requires additional consideration in the modelling. (FIGS. 3B, C).

A computational model was developed to address these issues. Specifically, an ordered fibril network was constructed according to a face-centered-cubic (FCC) lattice with a high initial connectivity of z=12. [30] Random deletion of fibrillar segments was implemented to reduce the connectivity of the network to desired levels (FIG. 3E). Stochastic displacements were imposed on each node to increase the randomness of the network. At the fibrillar joints, combined linear and angular springs, i.e., crosslinkers, were added between each pair of fibrils to restrain their relative separation and rotation (FIG. 3D). In FIG. 3D, if a welded node contains three crosslinked fibrils, 3 pairs of linear and rotational springs are introduced to represent the interconnection among them. In addition, breakage of the crosslinker was assumed to take place once the stored elastic energy exceeded a critical value, defined as the binding energy of the crosslinker. [31] Physically this binding energy can be attributed to the interactions between ANF-PVA, ANF-ANF, and PVA-PVA at the fibrillar joints. A finite element method was used to simulate the response of the network under imposed strain with periodic boundary conditions. Individual fibrils were modelled as 3D nonlinear Reissner beams that can undergo large stretching, bending, and twisting deformation. [30] The Young's modulus and the diameter of the fibrils were set to be E=18.2 GPa and d=50 nm, respectively, emulating the mechanics of fibrils in CNAs. The lengths of fibrils (or equivalently the mean distance lc between two nodal points, refer to Table 2) in each network were adjusted by a scaling factor to ensure a constant solid fraction of ~24%, corresponding to that of CNA-76.

TABLE 2

Parameters used in the simulation.

| Connectivity z | Mean distance $l_c$ | Linear spring stiffness $\kappa_s$ | Rotational spring stiffness $\kappa_r$ | Breakage energy $E_m$ |
|---|---|---|---|---|
| 6.2 | 0.267 μm | 72 μN/μm | 45 nN · μm | 10 nN · nm |
| 5.4 | 0.25 μm | 72 μN/μm | 45 nN · μm | 10 nN · nm |
| 4.3 | 0.22 μm | 72 μN/μm | 45 nN · μm | 10 nN · nm |
| 3.5 | 0.2 μm | 72 μN/μm | 45 nN · μm | 10 nN · nm |

The elongation of CNAs is mostly governed by the bending, enforced deformation and breakage of crosslinkers at nodal points, rather than the stretching and fracture of individual fibrils.

Groups of 3D networks were constructed with average connectivity of z=3.5, 4.3, 5.4, and 6.2 and their responses were simulated under imposed deformation. Interestingly, the compressive stiffness of the networks increases drastically with increasing nodal connectivity, despite the fact that all of the networks are formed from the same material with a constant solid fraction (FIG. 3F). This observation highlights the significance of nodal connectivity in CNAs. All of the simulated networks exhibit a finite rigidity even with an average connectivity below the rigidity threshold in Maxwell model ($z_{fc}$=6). This behavior correlates to the fact that jointed fibrils cannot freely rotate with respect to each other, allowing networks with a low connectivity to resist deformation.

The tensile behaviors of the networks can be simulated with a linearly increasing imposed strain until their total fracture. Similar to the behaviors under compression, tensile moduli of the networks exhibit a strong dependence on their average nodal connectivity (FIG. 3G). Results from the simulation of z=5:4 match the experimental observations from CNA-76. Furthermore, after an initial linear stage, the networks experience significant strain softening, which agrees with the experimental observation. Further examination shows that such softening behavior is caused by the successive breakage of crosslinkers, which indicates that networks with high connectivity allow energy dissipation while maintaining structural integrity. In this regard, the binding energy of crosslinkers plays a critical role in determining the macroscopic strength and toughness of the network. Indeed, increasing the binding energy leads to an elevated fracture strength of the material (FIG. 3H). In contrast, a lower binding energy of the crosslinkers will trigger an earlier softening of the material and a reduced fracture strength. These simulation results highlight the significance of welded high-connectivity joints in CNAs for their high tensile strength and toughness. On the other hand, changing the stiffness (i.e., the effective spring constant) of crosslinkers has only a minor influence on the macroscopic properties of the network (FIG. 3I). The high energy dissipation capability of CNAs can also be seen from their hysteresis under cyclic tensile loading. Finally, it should be noted that strain-stiffening commonly observed in water-rich biological tissues did not occur in the simulation of the present invention [32,33], which is reasonable due the presence of successive breakage of fibrillar joints within aerogel materials.

Figures 4A, 4B, 4C, 4D, 4E, 4F, 4G, 4H, 4I, 4J:
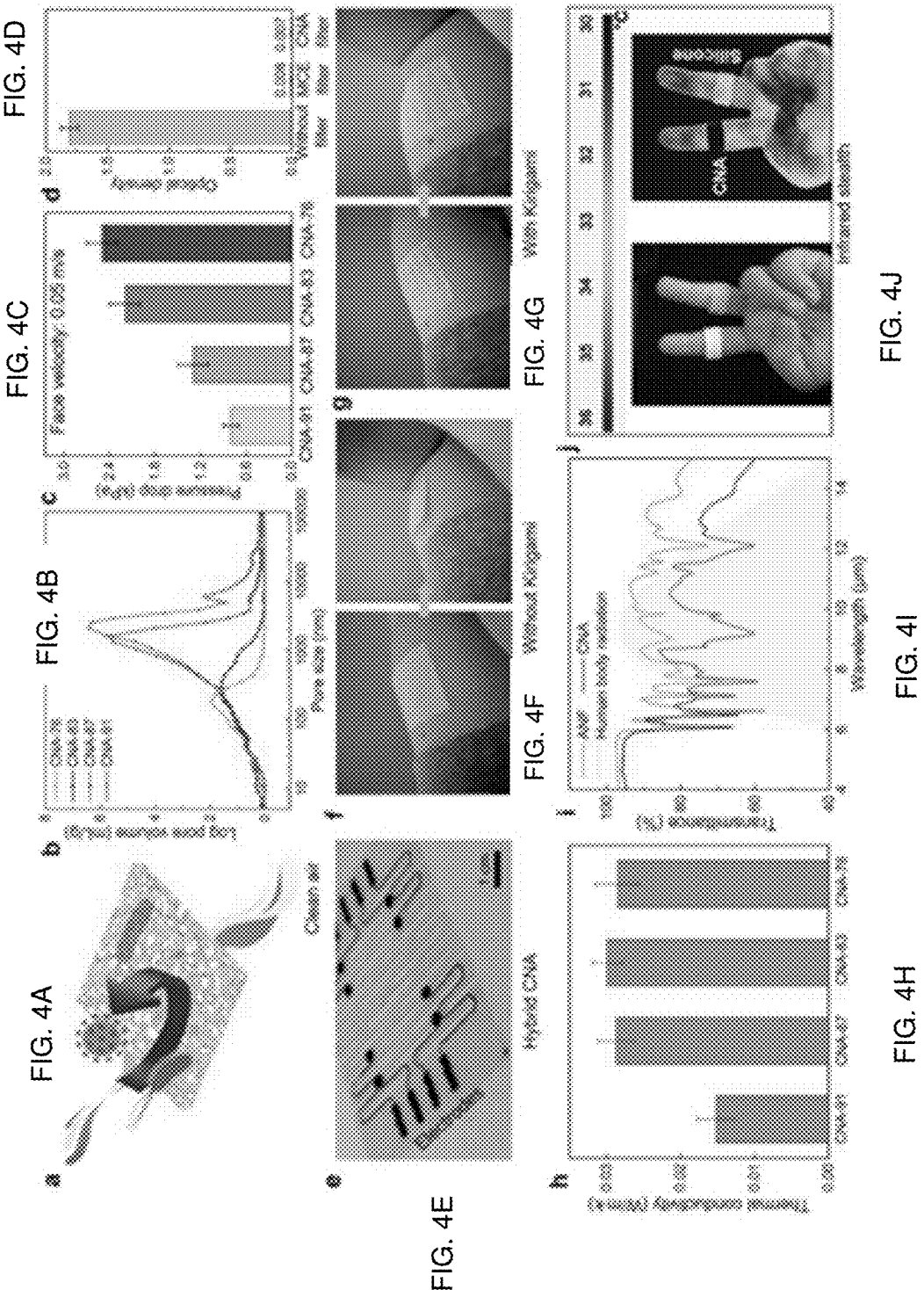
FIG. 4A is a schematic of a CNA membrane serving as an air filter.
FIG. 4B is a graph of pore size distribution of CNAs with various levels of porosity.
FIG. 4C is a bar graph of the drop of air pressure across 20-μm-thick CNA membranes, measured under a face velocity of 0.05 $ms^{-1}$.
FIG. 4D is a bar graph of filtration efficiency of CNA membranes against airborne bacteria, as compared with commercial MCE membranes.
FIG. 4E is a kirigami CNA membrane with a pattern of conductive ink infiltrated into the porous structures, serving as electrodes and interconnects for wearable electronics.
FIG. 4F is a photograph showing the conformability of a kirigami CNA membrane on the dynamic 3D surface of human skin as compared with a membrane without Kirigami.
FIG. 4G is a photo similar to FIG. 4F with Kirigami.
FIG. 4H is a bar graph of thermal conductivities of CNAs with various levels of porosity.
FIG. 4I is a graph of infrared transmittance spectra of CNA and pure ANF, as compared with the spectrum of human body radiation
FIG. 4J is a photograph and an infrared thermal image showing the thermal stealth behavior of a CNA membrane as compared with silicone.
Figures 5A, 5B, 5C:
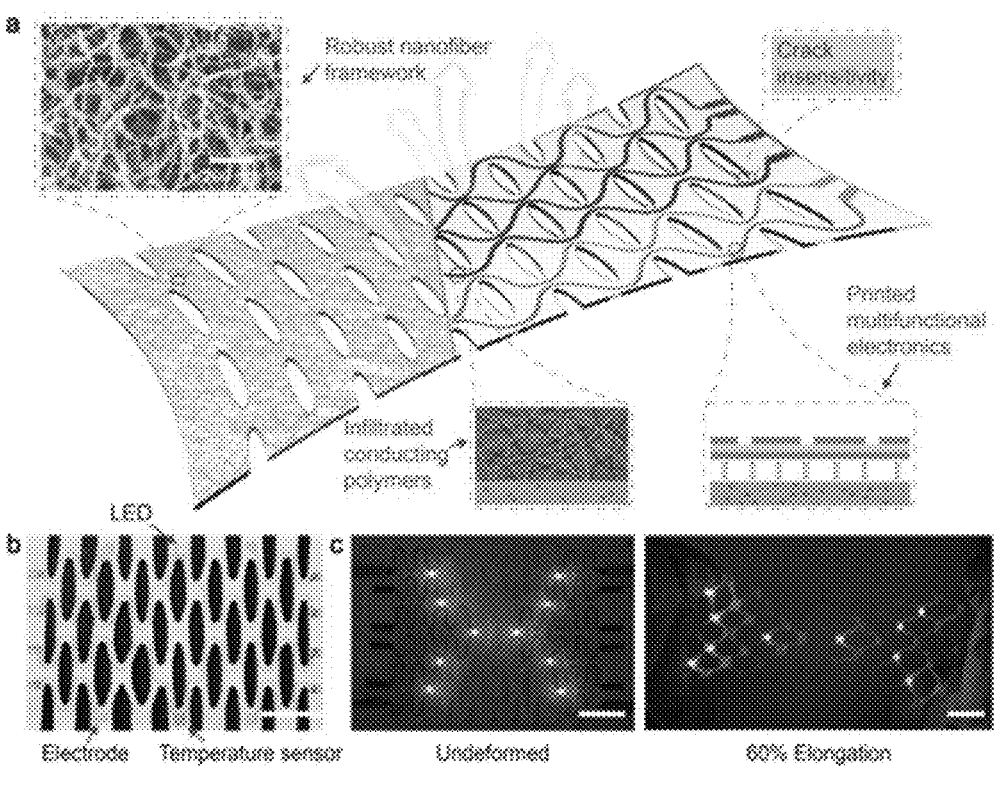
FIG. 5A is an image of a composite nanofiber framework (CNFF)-based kirigami membrane based on CNA with transfer-printed microelectronics and infiltrated conducting polymers.
FIG. 5B is an actual image showing a CNFF-based kirigami membrane with integrated multifunctional electronics including LED, bioelectrodes and temperature sensor.
FIG. 5C is a set of photographs of CNFF-based kirigami electronics showing a stretchable LED array powered with serpentine interconnects from conducting polymers.

In addition to the superb mechanical properties, the manufacturability of CNAs enables a range of applications as membrane devices. For instance, the porosity of CNAs enables selective mass transport and air filtration (FIG. 4A). The average pore sizes of CNAs range from 140 nm to 1,463 nm, which can be adjusted by tuning of the solid content (FIG. 4B). CNA membranes with a thickness of ~20 μm exhibit a good air permeability, with a pressure drop of 0.9-2.2 kPa under a face velocity of 0.05 ms$^{-1}$ (FIG. 4C). They showed excellent bacterial filtration efficiency on par with commercial membranes based on mixed cellulose ester (MCE) (FIG. 4D), while the fracture toughness of CNAs can be an order of magnitude higher than that of MCE. In FIG. 4D the optical density at 600 nm wavelength (OD600) is proportional to cell concentration.

In another application, the CNA membranes can be utilized for wearable electronics. Conductive inks can infiltrate into the porous structures of CNAs to generate patterns of electrodes and interconnects (FIG. 4E).

Kirigami structures can be introduced into the CNA membrane, leading to a reconfigurable device conformal to the 3D surface of skin (FIG. 4F and FIG. 4G). In this case, the high fracture toughness of CNAs is beneficial for preventing cracking at the edges of kirigami cuts. Furthermore, the low thermal conductivity and high infrared absorption of CNA membranes may enable a thermal stealth in a wearable configuration. In particular, the thermal conductivity of CNAs drops from ~0.028 to 0.014Wm-1 K-1, as the porosity increases from 76% to 91% (FIG. 4H). In addition, CNAs exhibit a strong absorption of mid-infrared (IR) radiation at 9.3 μm, which is close to the peak emission wavelength (~9.5 μm) of the human body (FIG. 4I) [34]. To demonstrate thermal stealth behaviors, two membrane rings from silicone and CNA were put on the index and middle fingers of a volunteer, respectively (FIG. 4J). The contrast in thermal images confirms the thermal stealth property of CNAs as compared with silicone.

In preparing CNAs according to the present invention, Kevlar para-aramid pulp (Type 979; DuPont) and poly(vinyl alcohol) (PVA; Mw: 146,000-186,000; 99%+hydrolyzed; Sigma-Aldrich) were used for the preparation of liquid precursors for CNAs. Briefly, Kevlar pulp was dispersed in dimethyl sulfoxide (DMSO) (3 wt %) under magnetic stirring at 95° C. for 7 days. PVA was dissolved in DMSO (15 wt %) under magnetic stirring at 95° C. for 7 days. Mixing these two liquid precursors with 1:1 mass ratio leads to the precursor of CNA-76. Precursors of CNAs with various porosities were obtained by adding additional pure DMSO to the mixture, retaining the mass ratio between dispersed ANFs and dissolved PVA at 1:5. For the preparation of bulk or film samples, the liquid mixture of ANF-PVA was poured into a mold or casted on a flat aluminium foil using a film coater. Solidification of ANF-PVA mixtures was achieved by solvent exchange in deionized (DI) water, leading to solid hydrogels. The hydrogel samples were immersed in ethanol for another 24 hours followed by critical point drying (CPD, Tousimis Autosamdri 931) to generate CNAs.

In determining the structural characterization of CNAs, the shrinkage of aerogels during drying was determined by:

$$\text{Shrinkage} = \left(1 - \frac{V_a}{V_h}\right) \times 100\% \qquad (1)$$

where $V_h$ and $V_a$ are the volumes of samples before and after supercritical $CO_2$ drying, respectively.

The morphology of the aerogels was observed under scanning with an electron microscope (SEM; Hitachi S4800 FEG). To identify the inner network of aerogels, hydrogel samples were frozen by liquid nitrogen and cut into halves to expose cross-sections and then dried by supercritical $CO_2$.

The porosity of CNAs was calculated by:

$$\text{Porosity} = \left(1 - \frac{6\rho_b}{\rho_a + 5\rho_p}\right) \times 100\% \qquad (2)$$

where $\rho_b$ is the density of bulk CNA sample.

The coefficients in the equation are based on the mixing ratio between ANF and PVA (1:5). The densities of ANF ($\rho_a$=1.44 g cm-3) and PVA ($\rho$p=1.19 g cm-3) are provided by suppliers. The pore size distribution of CNAs with different densities was measured by mercury intrusion porosimeter (MIP, AutoPore IV 9600) with the pressure ranging from 0.1 to 6.1×104 psi.

Mechanical tests were also carried out. For tensile tests, samples were cut into dumbbell shape (15 mm in length, 3 mm in width and 1.5 mm in thickness) and loaded with a tensile-compressive tester (Zwick Roell) at a deformation rate of 100% min-1. Cylinder samples (10 mm in diameter and 3 mm in thickness) were tested in compression with a deformation rate of 50% min-1. See FIGS. 1I and 1J.

For a comparison with data reported in the literature, the area under the stress-strain curve was calculated until fracture as an estimate of the toughness for various materials, with a unit of kJ m$^{-3}$. Fracture energy (T) of CNAs was measured by both tearing test and pure shear test35, with a unit of J m$^{-2}$. For the tearing test, film samples (8 mm in width, 50 mm in length and 300 μm in thickness) were cut into a trouser shape with a notch of 20 mm in length. The two arms of samples were mounted on the mechanical tester and stretched at a constant velocity of 1.7 mm s$^{-1}$. (FIG. 11A) The Γ was calculated from the steady state tearing force F as $$\Gamma = 2F/t, \tag{3}$$

where t is the thickness of the sample.

Rectangular samples (30 mm in width (w), 20 mm in length and 0.8 mm in thickness (t)) were used for the pure shear test. A 15-mm notch was cut into the width of the samples. Samples were mounted on two clamps with a fixed distance of 15 mm. The force-extension curves were recorded at an extension rate of 1.7 mms$^{-1}$. The fracture energy was calculated by:

$$\Gamma = U(L_C)/(w \times t) \tag{4}$$

where $U(L_C)$ is the work done by the tensile force on an unnotched samples up to a critical extension length ($L_C$), which is determined by the extension distance when cracks start to propagate for the corresponding notched samples. The fracture energies obtained from tearing tests and pure shear tests are consistent (FIG. 10 and FIG. 11).

The deformation of microfibrillar networks can be modelled. In order to do this 3D fibrillar networks interconnected by breakable crosslinkers were generated in silico from FCC lattice (with dimension $6\sqrt{2}l_c \times 6\sqrt{2}l_c \times 6\sqrt{2}l_c$ re $l_c$ is the distance between two neighboring nodes) as proposed by Broedersz et al. [30]. Perfect face centered cubic (FCC) lattice networks have an initial coordination number z=12, placing them well above the central-force (CF) isostatic threshold connectivity ($z_{cf}$=6) according to the Maxwell rigidity theory. In contrast, most previous models for stiff-fiber networks have a maximum coordination number 4. The effects of network connectivity can be explored by randomly removing fibrillar segments between nodes until the desired connectivity is reached. At the same time, the value of $l_c$ is chosen to ensure the fiber density equals that in the experiment. Six random networks were generated at each connectivity level to make sure results and conclusions obtained from the simulations were representative enough. The finite element method was then used to capture the deformation responses of networks where each fibril was modelled as a three-dimensional Reissner beam [36] that can undergo large rotation, stretching, bending and twisting. The Young's modulus of fibrils was taken to be E=18:2 GPa, given that the mass ratio between ANF and PVA is 1:5 and the tensile moduli of PVA and Kevlar 979 fiber are ~960 MPa (measured experimentally) and ~123 GPa [37], respectively. The diameter of fibrils was taken to be d=50 nm, which corresponds to the approximate diameter observed in SEM [27]. Each pair of jointing fibrils were assumed to be connected by crosslinkers modelled by linear and rotational springs with spring constants of Ks and Kr, respectively.

Consequently, the strain energy stored in each deformed crosslinker is $$E_c = \frac{1}{2}\kappa_s \delta l^2 + \frac{1}{2}\kappa_r \delta\theta^2 \tag{5}$$

where δl is the separation of the intersecting points and δθ is the change in the relative angle between two fibrils.

In addition, once the energy reaches a critical value Em, the crosslinker will break. Finally, periodic boundary conditions were enforced on each side of the simulation box. During simulation, the bottom side of the box was assumed to be fixed when the top side was forced to move in the vertical direction according to how the tensile or compression strain was applied to the material in the experiments and the reaction force was recorded, allowing construction of the stress-strain curve. Unless stated otherwise, the values of parameters adopted in the simulations are listed in Table 2 above.

Figures 12A, 12B:
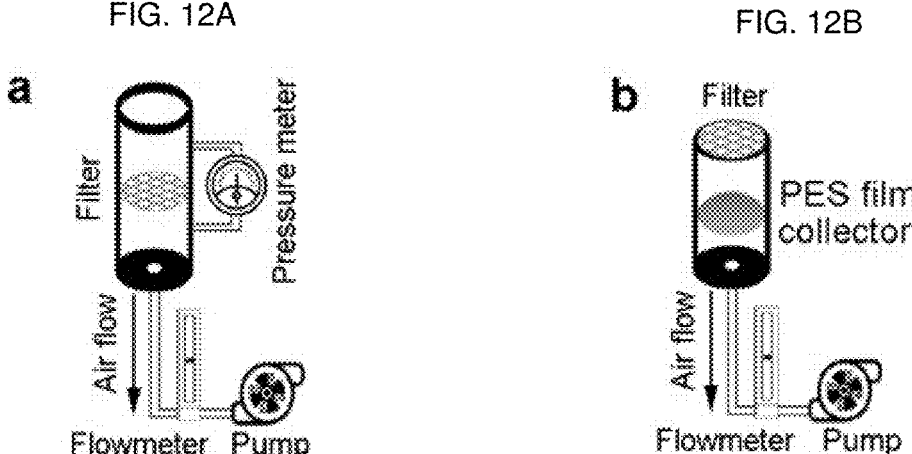
FIG. 12A is a schematic of the setup for the measurement of air permeability and FIG. 12B is a schematic of the setup for the measurement of the filtration of airborne bacteria.

Air filtration tests were also conducted. CNA-83 films with a thickness of 20 μm were tested and compared with commercial MCE films (MF-Millipore™ Membrane Filter, 0.22 μm pore size). Briefly, ambient air was pumped through filtration funnels (Corning) for 4 days, with a polyethersulfone (PES) film collecting residual airborne bacteria after the filtration (FIG. 12). The air flow rate was controlled at 2 L min-1. After 4 days of air filtration, PES collectors were immersed in 10 m$^{-1}$ of Lysogeny broth (LB) in 50 m$^{-1}$ Falcon tubes. Following shaking incubation at 37° C. with 220 rpm agitation for 24 h, the concentration of bacteria in the suspension was quantified by measuring the optical density at 600 nm (OD600) with a spectrophotometer (Ultrospec 2100 pro). Data is expressed as the mean of three replicates. The permeability of CNA membranes was also tested with additional experiments.

CNA samples with 100 mm diameter and 1 mm thickness were measured by a thermal conductivity analyser (Hot Disk TPS 3500). The IR transmittance was measured from aerogel films with a thickness of 200 μm, using a Fourier-transform infrared (FTIR) spectrometer (Thermofisher IS50). Thermal images were taken with an infrared imaging camera (Fluke Ti480).

Figures 6A, 6B, 6C, 6D, 6E, 6F, 6G, 6H, 6I, 6J:
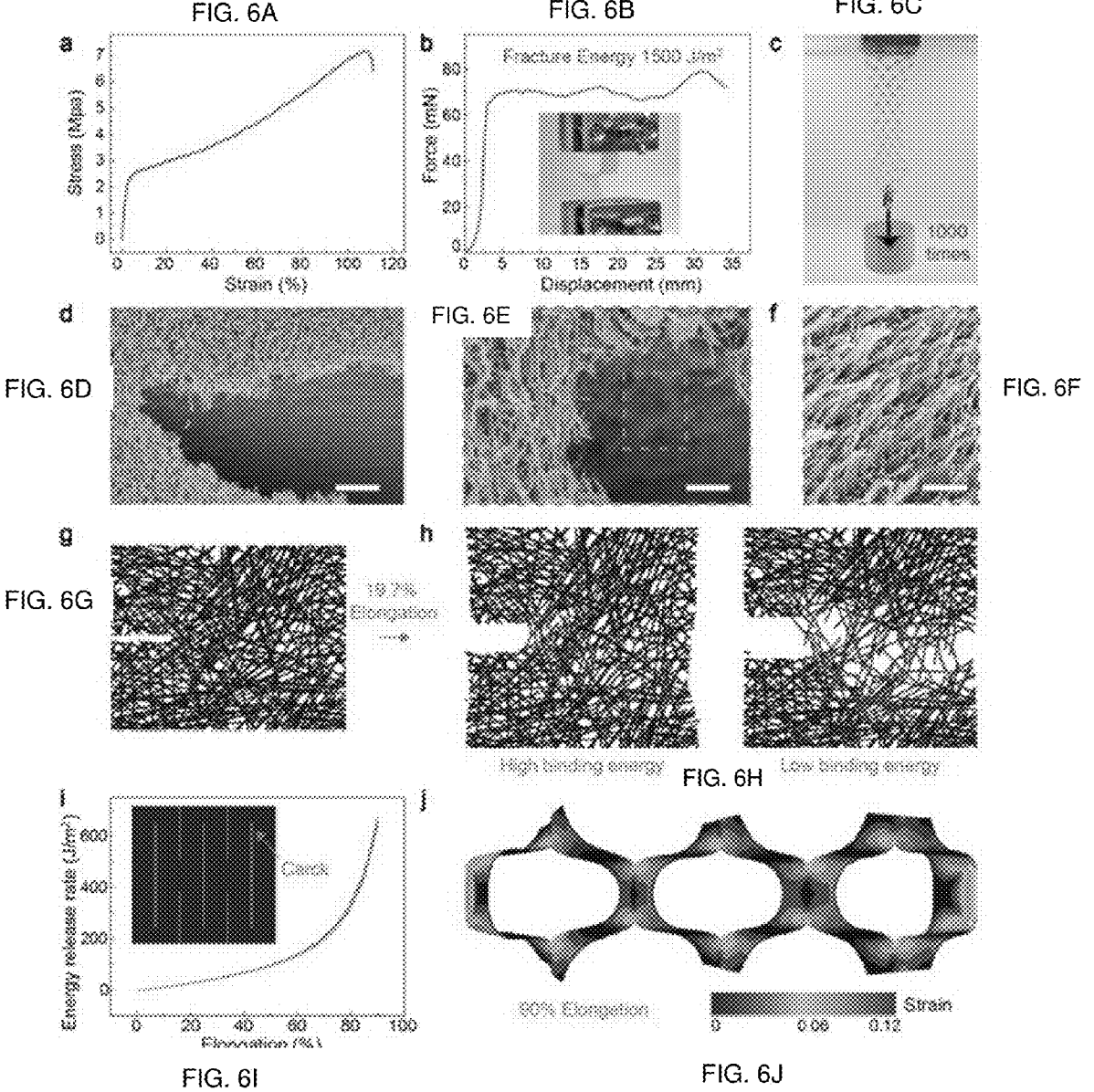
FIG. 6A is a graph of the tensile response of a continuous CNFF membrane.
FIG. 6B is a graph of the fracture energy of the CNFF determined by a standard tearing test.
FIG. 6C is a schematic drawing of a CNFF-based kirigami membrane capable of bearing a weight of 250 g, demonstrating its high mechanical strength.
FIGS. 6D-6F are scanning electron microscope (SEM) images of the fracture surface of CNFFs showing the microstructural basis of their high toughness at scales of 5 µm, 1 µm and 500 nm respectively.
FIG. 6G is an illustration of a computational model of a crosslinked fibrillar network with an initial crack.
FIG. 6H shows two distinct levels of fibrillar binding energy that lead to different responses of the crack-incorporated fibrillar network under imposed elongation.
FIG. 6I shows the energy release rate for crack propagation as a function of the elongation imposed on a CNFF-based kirigami membrane revealed by finite element analysis, where the inset shows the geometry of the kirigami pattern
FIG. 6J shows the strain distribution in the CNFF-based kirigami membrane, undergoing up to 100% elongation from the FEA simulation.
Figure 13:
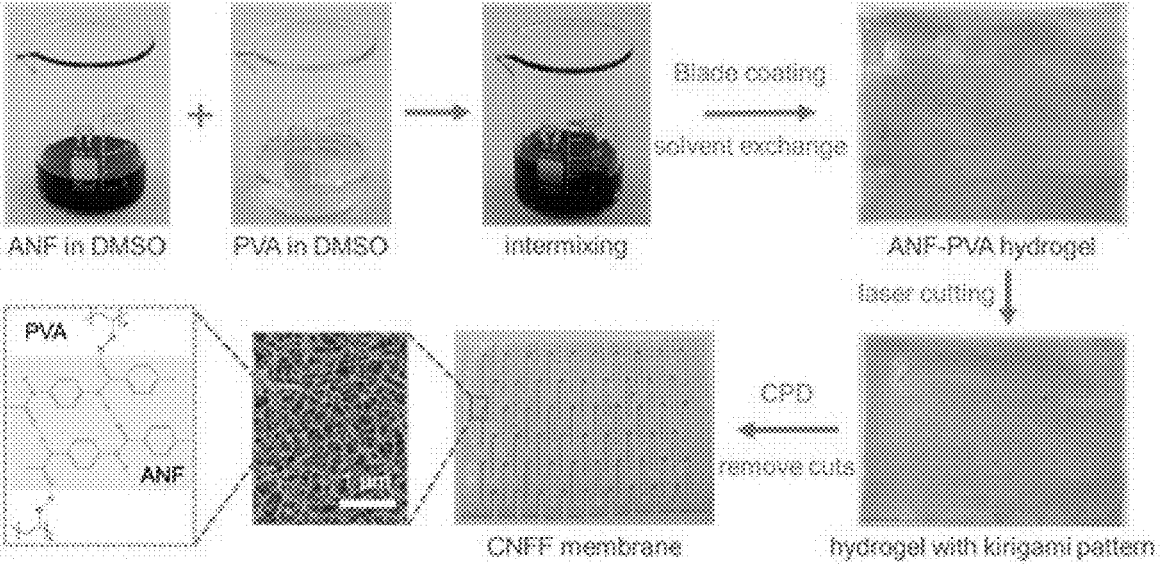
FIG. 13 is a diagram of another fabrication processes for CNFF-based kirigami membranes.

When the present CNA invention is used for the engineering of kirigami membranes, the mechanical behaviors of the base materials are critically important. A composite nanofiber framework (CNFF) is fabricated from CAN as a thin film with a specific solid content while CNAs in general may have a variety of solid contents and shapes, including that of CNFF. When used for kirigami membranes, CNFF exhibits unique properties originating from the interactions between its nanoscale constituents, i.e., hydrogen bonding between stiff ANFs and flexible polyvinyl alcohol (PVA) (FIG. 13). In FIG. 13 the insets show the details of the mixing of the liquid precursors, blade coating, solvent exchange, laser cutting and CPD, as well as the microstructures of the CNFF. Solution-based processing followed by critical point drying (CPD) enables self-assembly of hyperconnective 3D network with strong welded fibrillar joints and high nodal connectivity. [27A] These microstructural features are crucial for the macroscopic strength and toughness of porous composites. [11, 24] Indeed, CNFF membranes (~100 μm in thickness) without kirigami cuts exhibit high ductility (~107%) and strength (~7.16 MPa) under tension (FIG. 6A). Their fracture energy (~1500 J/m$^2$) can be an order of magnitude higher than those of common polymers used in electronics (e.g., SU-8), and is comparable to that of natural rubber (FIG. 6B). [29, 62] A stretchable kirigami membrane from CNFF can bear loads ~1,000 times higher than its own weight without mechanical failure or propagation of the cuts (FIG. 6C).

Microstructural examination of the fracture processes revealed the origin of the high toughness of CNFF. Interestingly, fracture of CNFF follows a tortuous path (FIG. 6D), indicating its high capability for strain energy dissipation. In addition, blunting of the crack tip and alignment of fibrils at the crack front were observed (FIG. 6E and FIG. 6F), which help to reduce stress concentration and resist further propagation of the crack. These observations are consistent with the network topology and nodal mechanics of CNFF. Specifically, the random nature of the 3D hyperconnective network is helpful for the deflection of crack propagation. On the other hand, the high nodal strength affords reorientation of fibrils without early breakage of their joints, which effectively transfers mechanical loads and mitigates the stress field induced around the crack tip.

Figure 14:
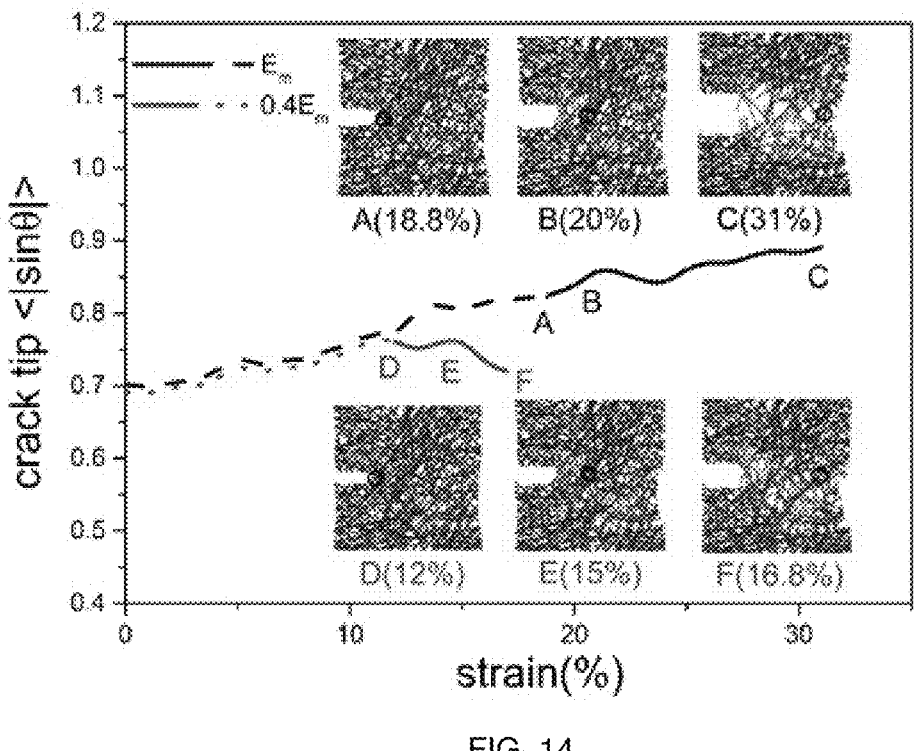
FIG. 14 is a diagram showing crack tip fiber alignment as a function of the imposed tensile strain under different crosslinker binding energies.

Computational models were developed to further examine the effects of fibrillar interactions on the toughness of CNFF. Specifically, a random network was generated with linear and rotational springs crosslinking each pair of intersecting fibrils. [30, 31] Binding energy was defined as the critical elastic energy stored in the springs before breakage of the crosslinks, reflecting strength of the fibrillar joint. We introduced an initial crack and simulated the responses of the fibrillar network under imposed elongation (FIG. 6G). With initial geometry of the network and stiffness of crosslinkers kept constant, high binding energy led to blunting and alignment of fibrils near the crack tip under imposed stretching (FIG. 6H), which is consistent with the experimental observations. FIG. 6H shows two distinct levels of fibrillar binding energy (equal to $E_m$ or $0.4 E_m$, with the value of $E_m$ given in Table 3, below) that lead to different responses of the crack-incorporated fibrillar network under imposed elongation. The red dots represent sites where crosslinking breakage takes place. In contrast, reducing the binding energy by 60% resulted in an early rupture of the network and much less re-orientation of the fibrils (FIG. 14). In FIG. 14 the black circle indicates the region where the value of $<|\sin \theta|>$, with $\theta$ being the angle formed by the fiber and horizontal direction, was calculated. Reducing the binding energy by 60% resulted in an early rupture of the network and much less alignment of the fibers.

Figures 15A, 15B, 15C:
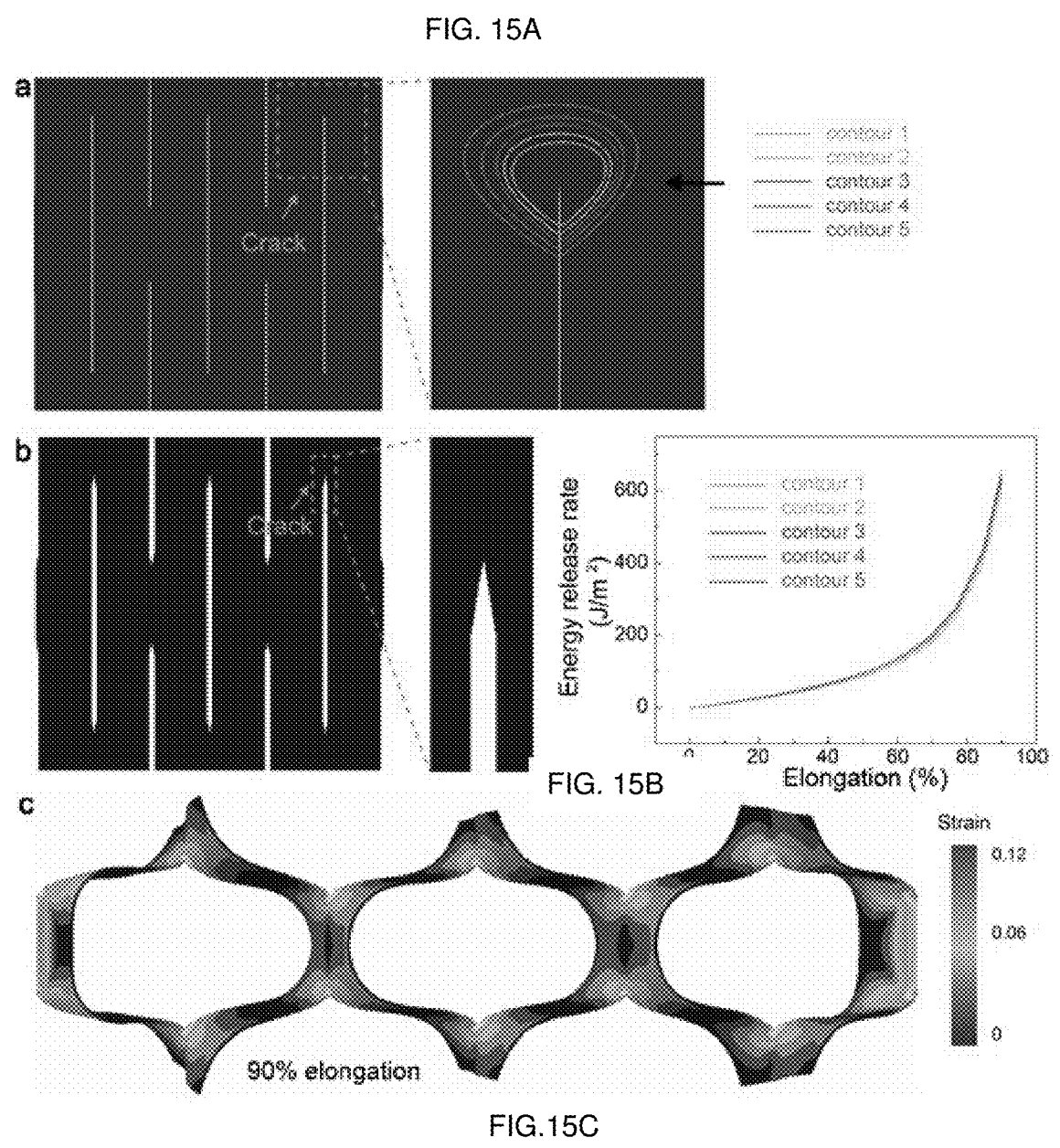
Figures 16A, 16B, 16C, 16D, 16E, 17A, 17B, 17C, 17D, 17E, 17F:
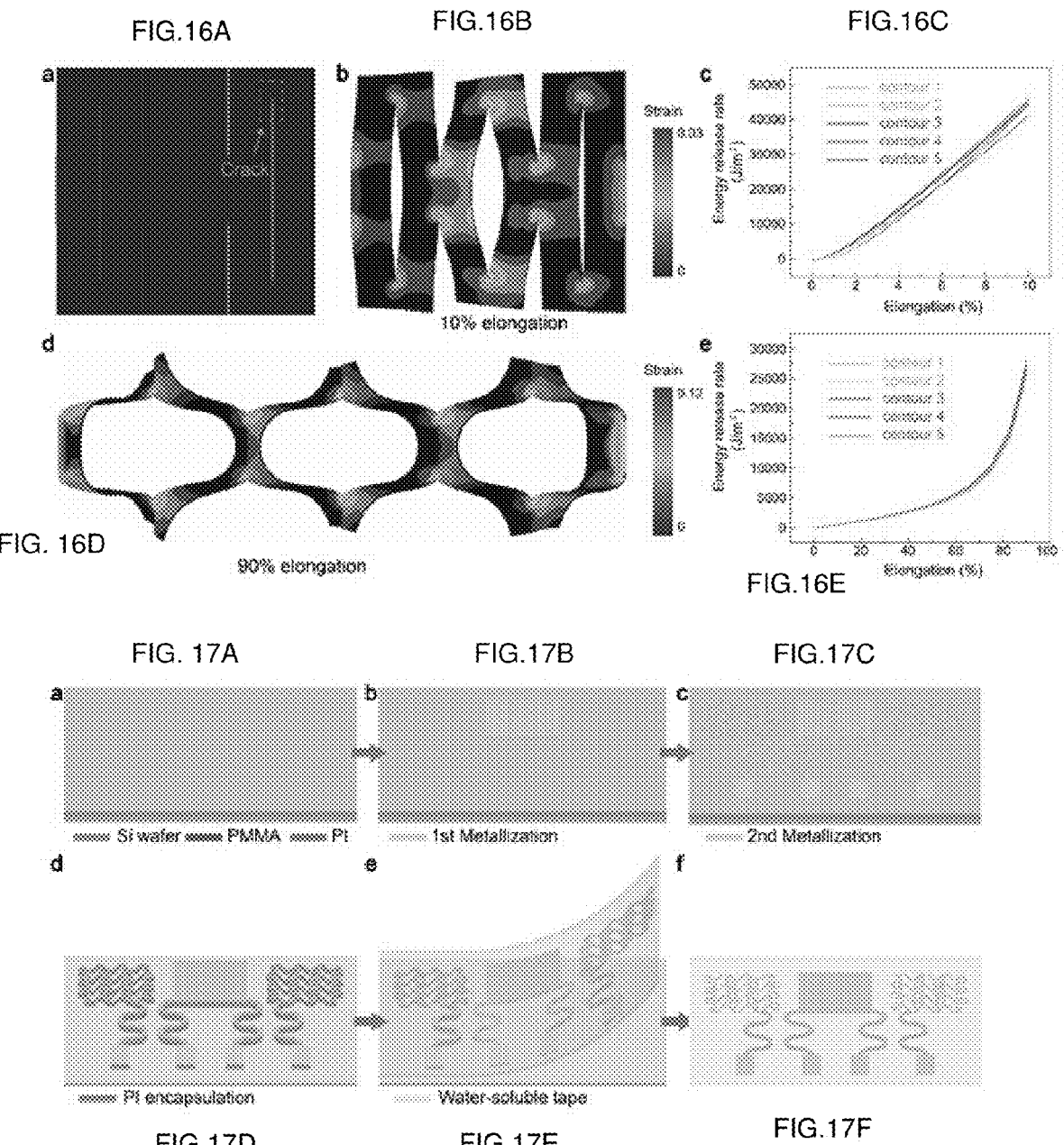
FIG. 16A illustrates FEA simulation on kirigami membranes based on single-crystal silicon (Si) and SU-8 epoxy with a design identical to that shown in FIG. 6I and FIG. 15A.
FIG. 16B shows strain distribution under 10% elongation imposed on a Si-based kirigami membrane with the Young's modulus set at 165 Gpa.
FIG. 16C is a graph of the energy release rate as a function of elongation imposed on the Si-based kirigami membrane.
FIG. 16D shows strain distribution under 90% elongation imposed on a SU-8-based kirigami membrane with the Young's modulus set at 2 Gpa and FIG. 16E is a graph of the energy release rate as a function of elongation imposed on the SU-8-based kirigami membrane.
FIG. 17A shows spin coating PMMA and PI on 4-inch silicon wafer.
FIGS. 17B and 17C show thin-film deposition, photolithography and etching for a $1^{st}$ metallization and a $2^{nd}$ metallization.
FIG. 17D shows application of the top PI encapsulation with the pattern defined by Reactive Ion Etching (RIE)
FIG. 17E shows water-soluble tape employed as a stamp for transfer printing after dissolving PMMA in acetone.
FIG. 17F shows the stamp-supported device.

The high toughness of CNFF is crucial for the structural robustness of kirigami membranes under deformation. Using finite element analysis (FEA), the energy release rates were evaluated for the extension of cuts and compared with the intrinsic fracture energy of the base material (e.g., CNFF), which provides a quantitative indicator of fracture resistance. Not surprisingly, under stretching, the sharp cuts introduced in the membrane create a driving force for crack propagation, with an energy release rate increasing with the imposed elongation (FIG. 6I and FIG. 15). Nevertheless, the fracture energy of CNFF ($\sim 1500$ J/m$^2$) is about two times higher than the energy release rate for crack propagation even when the imposed elongation reaches 90%, and it therefore prevents propagation of the cuts. In addition, the strain distributed in the membrane is well below the failure strain of CNFF, indicating high stretchability of the structure (FIG. 6J). In contrast, kirigami membranes based on other electronic materials, such as single-crystal silicon or SU-8 epoxy, cannot achieve such levels of structural robustness. Specifically, with the same set of geometrical designs, the simulated energy release rates exceeded the intrinsic fracture energy of the constituent materials (e.g., $\sim 10$ J/m$^2$ for silicon or $\sim 107$ J/m$^2$ for SU-8) even at low levels of stretching ($<10\%$) (FIG. 16), suggesting early onset of crack propagation and potential failure of the device. [62, 63, 64]

Figures 7A, 7B, 7C:
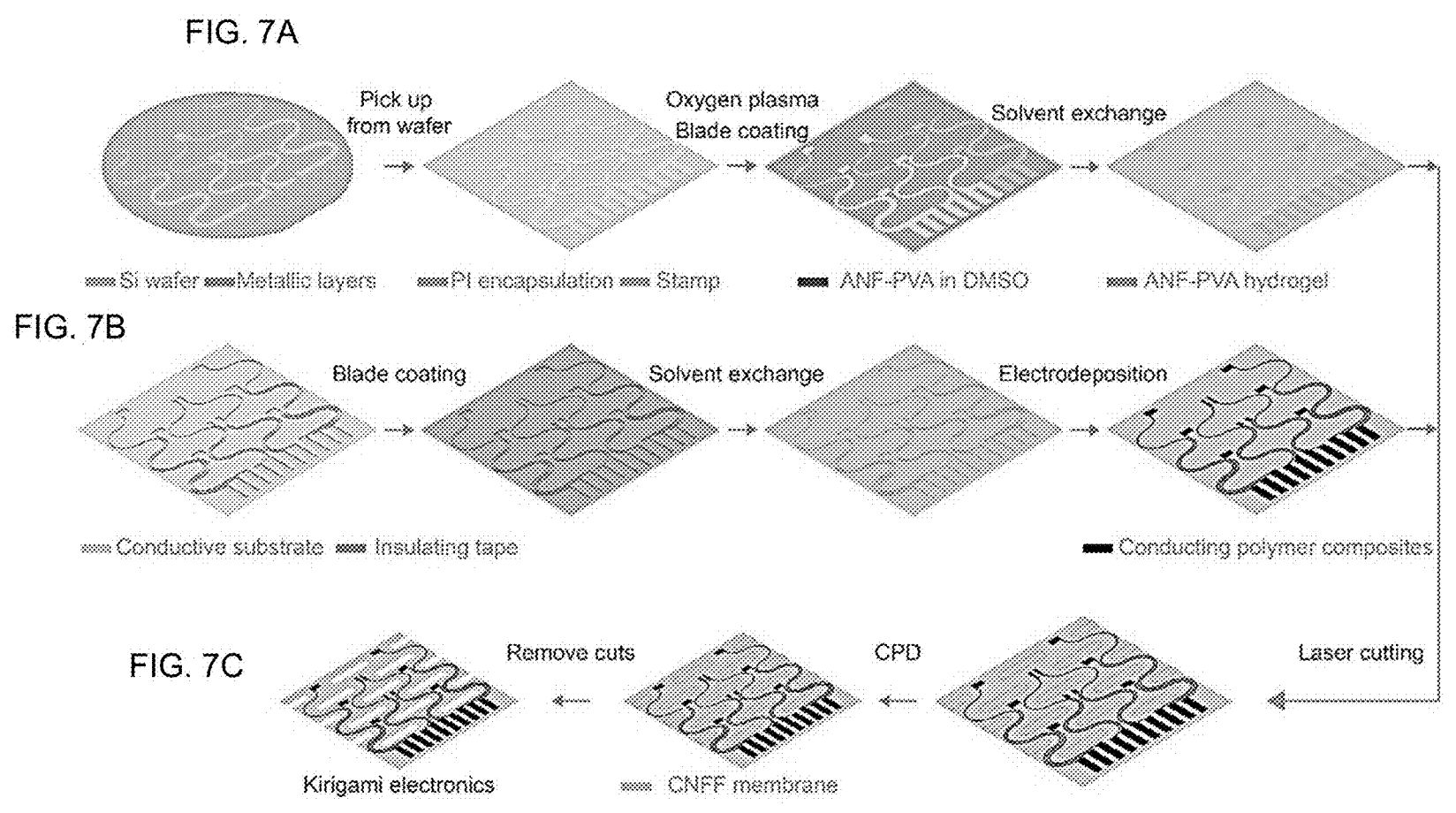

The outstanding mechanical properties and processability of CNFF allow reliable fabrication of multifunctional kirigami electronics. Indeed, a liquid mixture of ANFs and PVA in dimethyl sulfoxide (DMSO) can be blade-coated or spin-coated, forming uniform membrane substrates. The hydroxyl groups on PVA are available for chemical interactions with other surfaces, allowing for strong bonding to transferred electronic devices. Furthermore, the porous CNFF affords infiltration of other functional materials to generate mechanically robust and electroactive composites for devices applications. Diverse routes have been developed for the fabrication of CNFF-based kirigami electronics (FIG. 7). Specifically, multifunctional devices involving inorganic electronic materials were microfabricated on a planar wafer coated with a sacrificial layer (e.g., polymethylmethacrylate, PMMA) (FIG. 7A and FIGS. 17-19). The electronics were encapsulated with polyimide (PI) layers to prevent current leakage and to allow subsequent chemical functionalization of the surfaces. After dissolving the sacrificial layer, the electronic components were picked up from the handling wafer with a soft stamp (e.g., water-soluble tape). Oxygen plasma treatment of the stamp-supported devices generates hydroxyl groups on the surfaces for further chemical interactions with the polymers in CNFF. Blade-coating a layer of liquid precursor of CNFF followed by solvent exchange with water yielded a hydrogel membrane firmly bonded with the electronic components (FIG. 22). The buckling of serpentine structures in FIG. 22A was due to the shrinking during CPD process with a scale bar of 100 μm In FIG. 22B the SEM image is of infiltrated PEDOT with a scale bar of 200 μm.

In another fabrication scheme, conducting polymers can be selectively deposited into the porous network of CNFF through electrochemical methods (FIG. 7B and FIG. 20). Specifically, a conductive substrate (e.g., steel plate) is masked with a laser-scribed insulating tape, with the openings defining the patterns for conductive surface. Blade-coating a layer of liquid precursor of CNFF followed by solvent exchange leads to a hydrogel membrane attached to the masked substrate. Next, the sample is immersed into an aqueous solution of monomers of interest (e.g., 3,4-ethylenedioxythiophene, EDOT). Applying appropriate potential and current (FIG. 21) through the conductive substrate leads to conducting polymers (e.g., poly(3,4-ethylenedioxythiophene), PEDOT) deposited into the porous network of ANF-PVA, with the patterns defined by the mask. In FIG. 21B the CNFF membranes with various PEDOT contents are controlled by the total charge transferred during electrodeposition. The scale bar is 1 μm. The interpenetrating microstructures involving nanofiber networks and conducting polymers afford strong interfacial bonding and high structural robustness under mechanical loads (FIGS. 21 and 22). These conductive patterns can serve as electrodes or interconnects for further applications.

To complete the fabrication of CNFF-based kirigami electronics, the device-bonded hydrogel membranes are laser-cut halfway through their thickness with kirigami patterns. This method preserves the geometry of the membrane during the shrinking process involved in CPD. After the drying process, the laser-scribed area of CNFF was fully removed, leading to highly stretchable kirigami electronics.

Figures 8A, 8B, 8C, 8D, 8E, 8F, 8G, 8H:
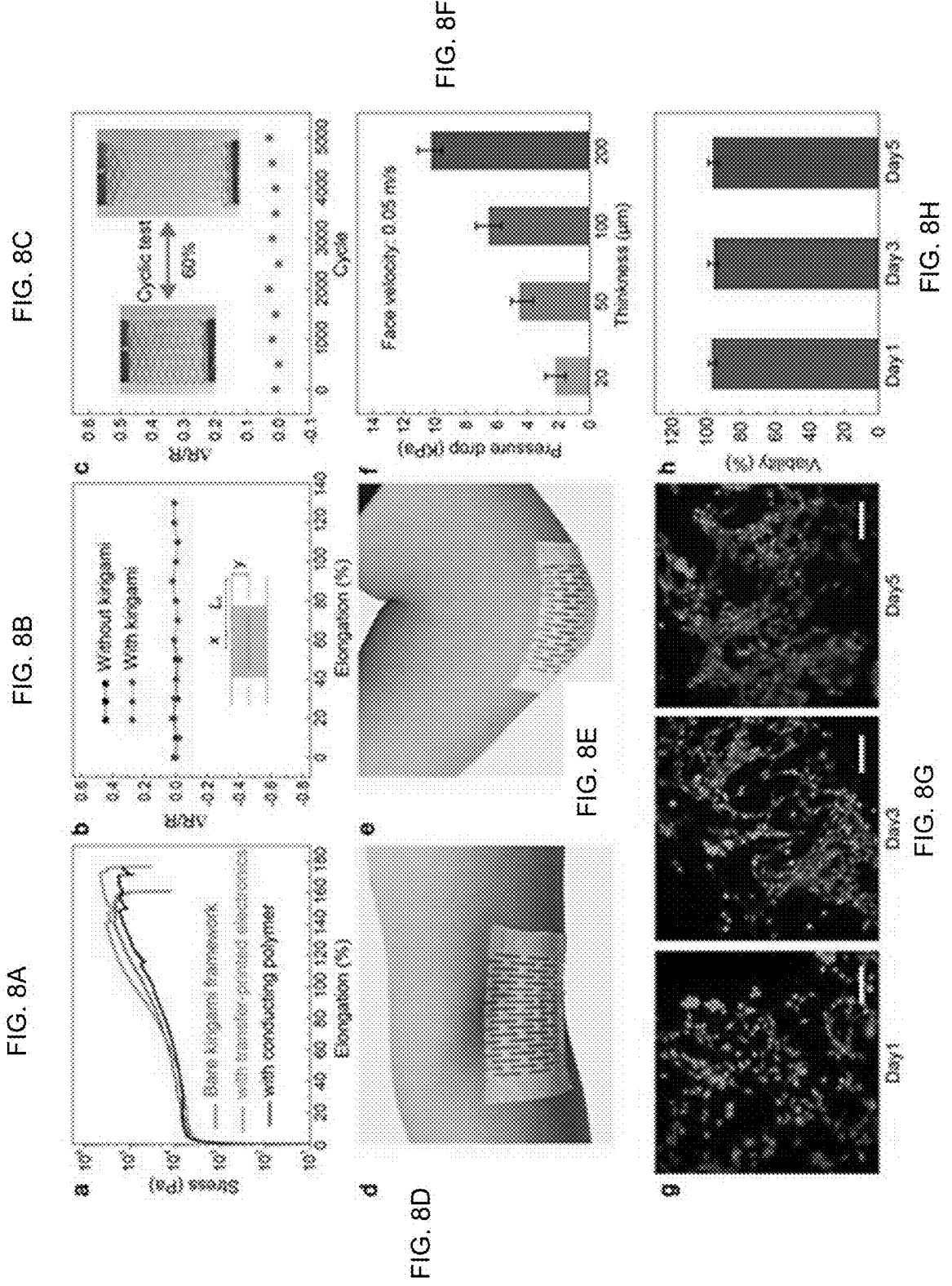
FIG. 8A shows graphs of tensile responses of a bare kirigami membrane and kirigami membranes with transfer-printed serpentine electronics or infiltrated conducting polymer interconnects.
FIG. 8B shows resistance variation for conducting polymer interconnects as a function of elongation imposed on CNFF membranes with or without kirigami cuts.
FIG. 8C shows the resistance variation of conducting polymer interconnects under 5,000 cycles of 60% elongation imposed on the kirigami membrane.
FIGS. 8D and 8E show a CNFF-based kirigami membrane conforming to the 3D dynamic surface of human skin at an elbow.
FIG. 8F is a bar graph of the air flow though CNFF membranes with various thickness leading to a moderate pressure drop across the membrane and demonstrating good permeability of the CNFF.
FIG. 8G shows live/dead assay of NIH 3T3 fibroblasts cultured on CNFF membrane for 1, 3 and 5 days
FIG. 8H is a bar graph of cell viability over 5 days of incubation.
Figures 23A, 23B, 24A, 24B:
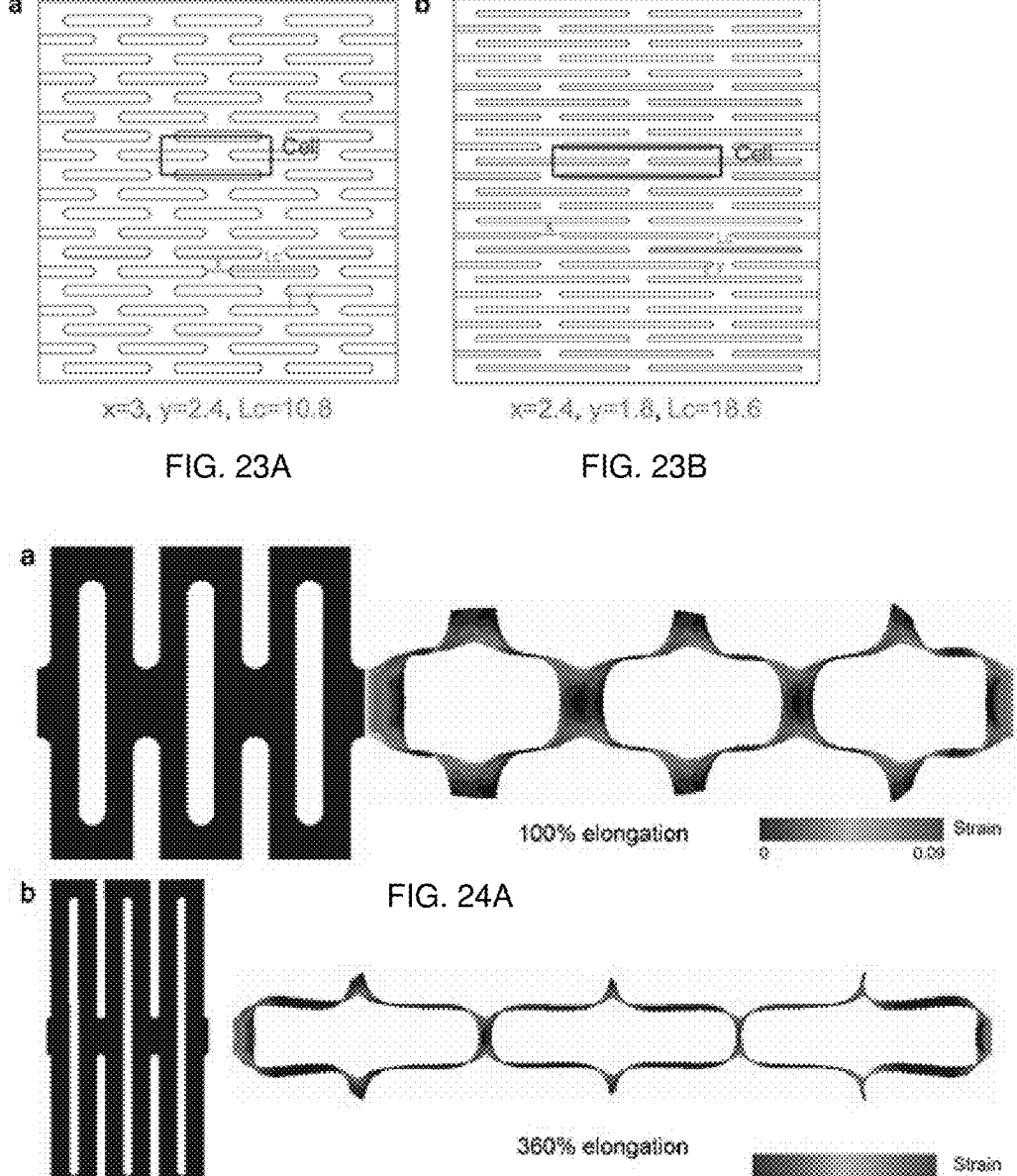
FIGS. 23A and 23B are schematic designs of two sets of kirigami patterns with different levels of stretchability that lead to distinct levels of stretchability for membranes with identical area.
FIG. 24A shows the strain distribution in the FEA simulation on the stretchable design shown in FIG. 23A under 100% elongation and FIG. 24B shows the strain distribution in a sample shown in Figure FIG. 23B under 360% elongation.

The performance of CNFF-based kirigami electronics was evaluated in the context of wearable applications. The stretchability of kirigami membranes scales with $(L_c-x)/2y$, where Le is the length of the cut, x is the spacing between nearest cuts in the transverse direction, and y is the spacing in the axial direction. [56] Modifying the kirigami patterns allows for tuning of the stretchability of the membranes (FIG. 23). To further reduce stress concentration under stretching, round edges of the kirigami cuts were designed for the fabricated devices (FIG. 24A). The fracture resistance of the design was evaluated by introducing cracks at the tip of the round edges in the FEA model of stretching. The simulated energy release rate remained an order of magnitude lower than the fracture energy of CNFF even under 100% elongation, indicating sufficient structural robustness (FIG. 25A). During experimental tensile tests, the behaviors of the kirigami membrane were barely influenced by the printed electronic components, but instead were largely determined by the intrinsic properties of CNFF as well as the structural design of the kirigami patterning (FIG. 8A). At low strains (<5%), the initial stiffness (~94.6 kPa) of the membrane is due to the stretching of CNFF. As the load reaches a threshold for triggering buckling, the deformation is mostly dominated by the out-of-plane deformation of the kirigami structures, leading to a low effective stiffness of ~19.7 kPa. Finally, the membrane failed at very high elongation due to tearing at the edge of kirigami cuts.

CNFF-based kirigami electronics exhibit stretching-invariant electrical properties. The resistance of serpentine interconnects in a kirigami membrane remains unchanged even under 130% of elongation (FIG. 8B). Indeed, the structural deformation of both the kirigami membrane and the serpentine interconnects accommodated the macroscopic elongation and led to low strains in the constituent materials. In contrast, serpentine interconnects bonded to a continuous membrane without kirigami patterning failed at a lower elongation of ~60%. Furthermore, CNFF-based kirigami electronics can withstand over 5,000 cycles of 60% elongation without causing significant change to the electrical resistance (FIG. 8C).

The high deformability of CNFF-based kirigami electronics enables conformal integration of the devices on the dynamic 3D surfaces of the skin (FIG. 8D and FIG. 8E). The porous microstructures of CNFF allow vapor transport, which was confirmed by a characterization of the air flow through CNFF membranes. Specifically, under a face velocity of 0.05 m/s, the presence of the CNFF membrane led to a moderate pressure drop ranging from 2 kPa to 10 kPa, corresponding to a thickness of the membrane ranging from 20 μm to 200 μm (FIG. 8F). It is conceivable that the intrinsic permeability of CNFF membranes, in conjunction with the structural openings created by kirigami cuts, enhances their breathability during extended wearing on the skin. The low density of CNFF (~0.15 g/cm$^3$) is also beneficial for wearable applications. In addition, the viability of NIH 3T3 fibroblasts cultured on CNFF indicates good biocompatibility of CNFF-based kirigami devices (FIG. 8G and FIG. 8H).

Figures 9A, 9B, 9C, 9D, 9E, 9F:
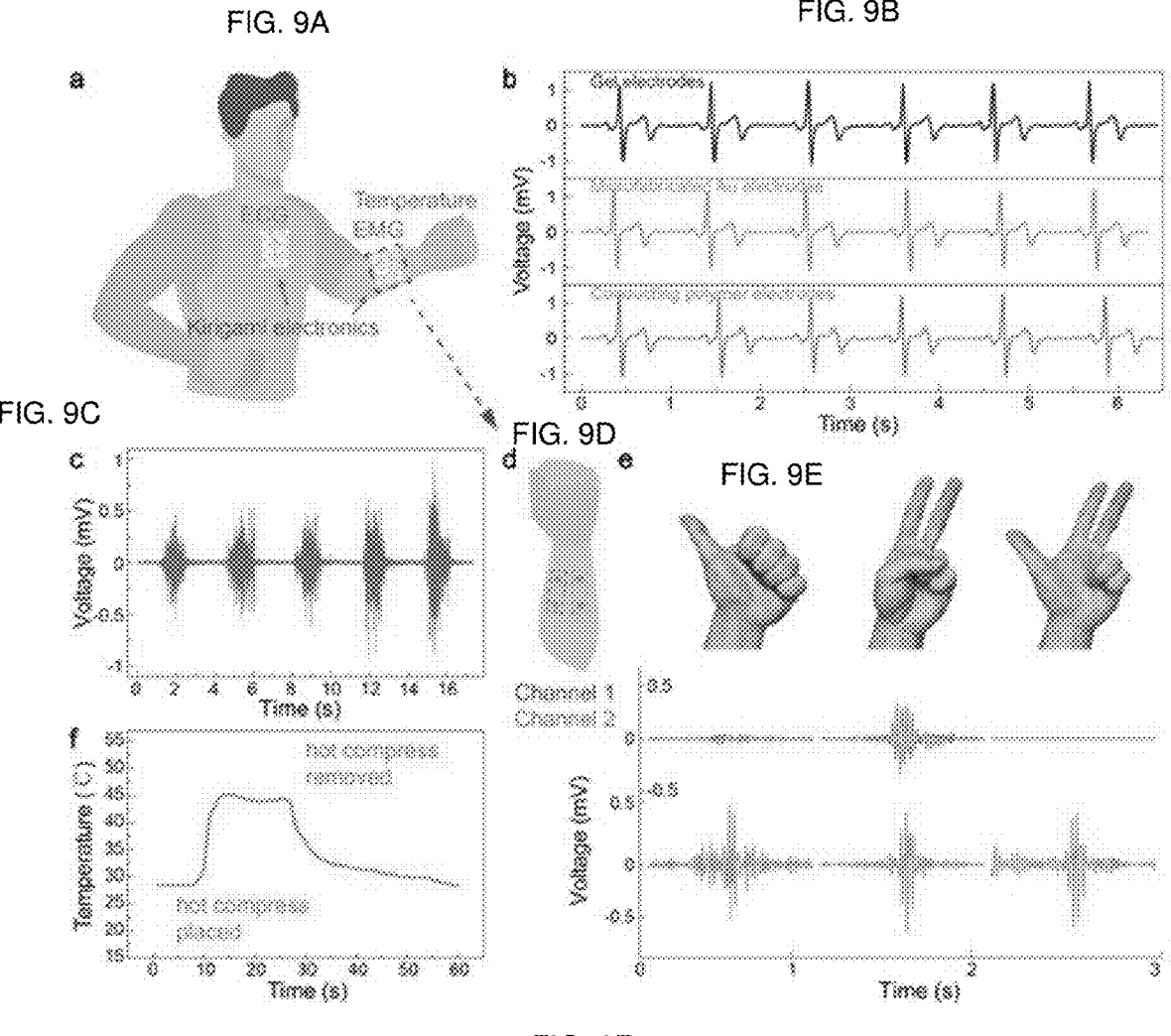
FIG. 9A is a schematic showing the capability of multifunctional kirigami devices for sensing various biological signals.
FIG. 9B illustrates ECG data measured with microfabricated Au electrodes (middle) and conductive polymer electrodes (bottom) integrated on CNFF-based kirigami membranes, as compared with the data measured with commercial gel electrodes (top)
FIG. 9C is an EMG recording with CNFF-based kirigami electronics.
FIG. 9D shows two pairs of microfabricated Au electrodes laminated on a human forearm that form two independent channels for EMG-based gesture recognition as shown in FIG. 9E
FIG. 9F shows temperature variation during a hot compress applied to the skin, recorded by a microfabricated sensor integrated on the kirigami membrane.

The multifunctional electronics built into CNFF-based kirigami devices enable characterization of various physiological information from the skin (FIG. 9A and FIG. 26). For example, the contact impedance between electrodes and the skin ranges from 120 kΩ to 180 kΩ at 100 Hz, which is sufficient for gathering high-quality electrophysiological signals (FIG. 27A). Indeed, electrocardiogram (ECG) signals captured by both transfer-printed gold (Au) electrodes and infiltrated PEDOT electrodes exhibited clean details comparable to those measured with commercial silver/silver chloride (Ag/AgCl) gel electrodes (FIG. 9B). An array of microfabricated electrodes laminated on the forearm can be used for the recording of electromyogram (EMG) (FIG. 9C).

EMG signals measured from different pairs of electrodes captured the distinct patterns arising from contraction of different muscle groups (FIG. 9D). This spatiotemporal information can be useful for gesture recognition or other applications for human-machine interactions. (FIG. 9E) Thermal sensors in the array are based on the temperature coefficient of resistance for gold traces (FIG. 27B) They were able to capture temperature variations in physiologically relevant processes, represented by a hot compress applied to the skin (FIG. 9F).

The fabrication of CNFF-based kirigami electronics can be achieved with the following steps. First, a 2 wt % ANF in DMSO and a 10 wt % PVA solution in DMSO are prepared using established methods. [27, 65] These two liquids are mixed in a water-free environment with 1:1 volume ratio to obtain a liquid ANF-PVA mixture. The liquid precursor is then blade-coated with controlled thickness followed by immersing it in deionized water to generate ANF-PVA hydrogel membranes. A kirigami pattern is introduced into the hydrogel membrane by laser cutting. After that, hydrogel membranes with a kirigami pattern are immersed in ethanol for 12 hours followed by CPD to generate CNFF membranes. The laser-scribed area is mechanically removed to complete the kirigami structures. Scanning electron microscopy (SEM, Hitachi S4800) is used to characterize the 3D microstructures on CNFF.

Various methods, including thin-film deposition, photolithography and etching (e.g., Reactive Ion Etching (RIE)), have been developed for the microfabrication of electronics. [66] The present invention uses water-soluble tapes (3M) as stamps to pick up microfabricated electronics from the handling wafer. Next, the stamp-supported electronics are treated with oxygen plasma (Tailong Electronics, China) and then blade-coated with a layer of liquid mixture of ANF-PVA. Finally, the tape-supported electronics covered with the mixture are immersed in deionized water to release the tape and solidify the ANF-PVA, leading to hydrogel-bonded electronics.

PET tapes are patterned with laser cutting and attached to a steel plate, serving as the mask for electrodeposition of PEDOT. ANF-PVA hydrogel attached on the mask is fabricated by blade coating and solvent exchange. EDOT (0.05 M) monomers, sodium dodecyl sulfate (0.2 M) and LiClO$_4$ (0.1 M) are dissolved in water for electrodeposition. Next, the sample is immersed in the solution and PEDOT is deposited on the interface between the hydrogel and conductive substrate by pulse electrodeposition (1.0 V vs Ag/AgCl, 1s, 0 V, 2s, 200 cycles). Finally, the interpenetrating ANF-PVA-PEDOT hydrogel electronics are peeled off from the electrodeposition mask.

With the present invention discrete network simulations can be achieved. In particular, 2D filamentous networks are generated by randomly placing 250 fiber, each with length l, into a box with dimension 2l×2l where periodic boundary conditions are enforced on each side of the box. An edge crack with a length of 0.5l is then introduced into the network (FIG. 6G). The fracture response of the network (when subjected to stretching in the vertical direction) is then simulated by treating each fiber as a Reissner beam [67] capable of undergoing large stretching and bending deformations. The mean distance of crosslinkers in the network is about 0.25 μm, which is consistent with experimental observation. A crosslinker modeled by a combined linear and rotational springs with spring constants of Ks and K, respectively can use the values in Table 3.

TABLE 3

| Crosslinker parameters used in the network simulations. | | | |
| --- | --- | --- | --- |
| Fibre length l | Linear spring stiffness $\kappa_s$ | Rotational spring stiffness $\kappa_r$ | Breakage energy $E_m$ |
| 4 μm | 72 μN/μm | 45 nN · μm | 10 nN · μm |

Finally, possible re-alignment of fibres at the crack front was assessed by monitoring the average value $<|\sin \theta|>$ of all fibers within the circle (with diameter 0.2l, see FIG. 14) just in front of the crack tip where $\theta$ represents the angle formed between the filament and the horizontal axis.

Commercial software (ABAQUS) was used for FEA simulation of the designed kirigami membrane, treated as an elastic thin layer with prescribed cuts (FIG. 6I), at the continuum level. A small perturbation was applied perpendicular to the membrane to trigger the 3D out-of-plane deformation of the kirigami structures. The minimum size of the elements was set to be one third of the thickness of the kirigami membrane (~100 μm). The elastic moduli (E) and Poisson's ratios (v) of various materials examined are as follows: $E_{CNFF}$=45 MPa, $v_{CNFF}$=0.46; $E_{Si}$=165 GPa, $v_{Si}$=0.278; $E_{SU-8}$=2 GPa, $v_{SU-8}$=0.252.

A tensile tester (Zwick Roel) was used to record the tensile response of the samples. Variations in the resistance of the specimens during uniaxial tensile and cyclic stretching tests were recorded by a digital source meter (2450; Keithley Instruments). Tear54 tests were used to obtain the fracture toughness (Γ) of CNFF. Specifically, Γ was calculated according to the formular Γ=2Flt, where F is the stable-state tearing force and t is the thickness of membrane.

NIH 3T3 fibroblasts were used to examine the in vitro cytotoxicity of CNFF. The samples were washed with ethanol and phosphate buffered saline (PBS, Gibco™ pH 7.4 basic (1×)) prior to cell seeding. A cell suspension containing ~2×10⁴ cells was seeded in culture plates containing the CNFF samples. The plates were placed in an incubator at 37° C. and 5% $CO_2$ after adding fresh medium, which was made by gentle mixing of 89% Dulbecco's modified eagle medium (DMEM, Gibco™, high glucose), 10% fetal bovine serum (Gibco™, qualified, Brazil), and 1% Penicillin-Streptomycin (Gibco™, 10,000 U/mL) in volume fraction. The live/dead assays were used to quantify the cell viability on days 1, 3 and 5. In FIG. 8H live cells are green, dead cells are red and the scale bars equal 100 μm. Briefly, after discarding the culture medium, 200 μl PBS staining solution (Invitrogen™) including 2 μM calcein-AM and 8 μM propidium iodide (PI) were added into the plate and then cells were incubated at room temperature for 15 mins according to product instruction. The cells were observed using a fluorescent microscope (Nikon Eclipse Ci-L, Japan). Cell viability was defined by the normalized ratio of the number of living cells to the total number of cells, where the live/dead status of around 600-700 cells on at least 3 hydrogel samples was collected for each day's vitability.

An array of multifunctional sensors, includes four unipolar electrodes, one pair of bipolar electrodes and one temperature sensor, were set up to make physiological recordings. On the other hand, the design for conducting polymer structures involves six pairs of bipolar electrodes. Wafer-fabricated electrodes and conducting polymer electrodes attached to the chest of a volunteer (FIG. 9A) were used to achieve high-quality ECG recordings (FIG. 9B and FIG. 9C) by a commercial data acquisition system (PowerLab T26, AD Instruments). Four wafer-fabricated unipolar electrodes attached to the forearm of a volunteer formed 2 independent channels to record EMG signals for gesture recognition. FIG. 9D Skin impedance and temperature were recorded with a LCR meter (E4980AL; Keysight Instruments).

In summary, a class of polymeric aerogels, i.e., composite nanofiber aerogels (CNAs), have been developed with outstanding mechanical properties originating from their hyperconnective fibrillar network. The theoretical models developed accurately depicted the observed mechanical behaviors of CNAs, revealing quantitative relationships between configurations of fibrillar joints and macroscopic material properties. The mechanistic insights obtained from these models are applicable to the engineering of a range of porous materials involving fibrillar networks. From technological perspectives, the excellent mechanics, porosity and manufacturability of these polymeric aerogels create diverse opportunities for flexible electronics, energy systems, biomedical devices and other applications.

One such development is a versatile composite nanofiber framework (CNFF)-based material platform for the construction of kirigami electronics for wearable applications. The high toughness, permeability, and processability of CNFFs are advantageous for the development of robust and multifunctional kirigami membranes that conform well to the 3D dynamic surfaces of the skin. The mechanical insights regarding the fracture resistance of CNFF-based devices revealed that they are also applicable to the engineering of other kirigami devices, and therefore provide guidance for their design and fabrication. Because of the manufacturability of CNFF-based devices, their capability for physiological sensing and stimulation can be further expanded. Inclusion of high-density electrode arrays, actuators, microfluidics or biochemical sensors is highly feasible, which could enable sophisticated wearable system for medical diagnosis, disease management, human-machine interactions, or other advanced applications.

The above are only specific implementations of the invention and are not intended to limit the scope of protection of the invention. Any modifications or substitutes apparent to those skilled in the art shall fall within the scope of protection of the invention. Therefore, the protected scope of the invention shall be subject to the scope of protection of the claims.

REFERENCES

The cited references in this application are incorporated herein by reference in their entirety and are as follows:

[1] Zhang, X., Vyatskikh, A., Gao, H. J., Greer, J. R. & Li, X. Y. Lightweight, flaw-tolerant, and ultra strong nano-architected carbon. PNAS 116, 6665-6672 (2019).

[2] Bauer, J. et al. Nanolattices: an emerging class of mechanical metamaterials. Adv. Mater. 29, 1703343 (2017).

[3] Zheng, X. Y. et al. Ultralight, ultra-stiff mechanical metamaterials. Science 344, 1373-1377 (2014).

[4] Zhao, S. Y. et al. Additive manufacturing of silica aerogels. Nature 584, 387-392 (2020).

[5] Danks, A. E., Hall, S. R. & Schnepp, Z. The evolution of 'sol-gel' chemistry as a technique for materials synthesis. Mater. Horiz. 3, 91-112 (2016).

[6] Owens, G. J. et al. Sol-gel based materials for biomedical applications. Prog. Mater. Sci. 77, 1-79 (2016).

[7] Xue, J. J., Wu, T., Dai, Y. Q. & Xia, Y. N. Electrospinning and electrospun nanofibers: Methods, materials, and applications. Chem. Rev. 119, 5298-5415 (2019).

[8] Ding, Y. C., Hou, H. Q., Zhao, Y., Zhu, Z. T. & Fong, H. Electrospun polyimide nanofibers and their applications. Prog. Polym. Sci. 61, 67-103 (2016).

[9] Qian, Z. C., Wang, Z., Zhao, N. & Xu, J. Aerogels derived from polymer nanofibers and their applications. Macromol. Rapid Commun. 39, 1700724 (2018).

[10] Zhao, X. H. et al. Soft materials by design: Unconventional polymer networks give extreme properties. Chem. Rev. 121, 4309-4372 (2021).

[11] Zhao, S. Y., Malfait, W. J., Guerrero-Alburquerque, N., Koebel, M. M. & Nystrom, G. Biopolymer aerogels and foams: chemistry, properties, and applications. Angew. Chem. Int Ed. 57, 7580-7608 (2018).

[12] Budtova, T. Cellulose ii aerogels: a review. Cellulose 26, 81-121 (2019).

[13] Song, J. W. et al. Highly compressible, anisotropic aerogel with aligned cellulose nanofibers. ACS Nano 12, 140-147 (2018).

[14] Heise, K. et al. Nanocellulose: Recent fundamental advances and emerging biological and biomimicking applications. Adv. Mater. 33, 2004349 (2021).

[15] Takeshita, S. et al. Formation of nanofibrous structure in biopolymer aerogel during supercritical CO2 processing: the case of chitosan aerogel, Biomacromolecules 20, 2051-2057 (2019).

[16] Wei, S., Ching, Y. C. & Chuah, C. H. Synthesis of chitosan aerogels as promising carriers for drug delivery: a review. Carbohydr. Polym. 231, 115744 (2020).

17. Duan, B., Huang, Y., Lu, A. & Zhang, L. N. Recent advances in chitin based materials constructed via physical methods. Prog. Polym. Sci. 82, 1-33 (2018).

[18] Qin, Y. Y. et al. Lightweight, super elastic, and mechanically flexible graphene/polyimide nanocomposite foam for strain sensor application. ACS Nano 9, 8933-8941 (2015).

[19] Meador, M. A. B. et al. Mechanically strong, flexible polyimide aerogels crosslinked with aromatic triamine. ACS Appl. Mater. Interfaces 4, 536-544 (2012).

[20] Li, X., Dong, G. Q., Liu, Z. W. & Zhang, X. T. Polyimide aerogel fibers with superior flame resistance, strength, hydrophobicity, and flexibility made via a universal sol-gel confined transition strategy. ACS Nano 15, 4759-4768 (2021).

[21] Chidambareswarapattar, C. et al. Fractal multiscale nanoporous polyurethanes: Flexible to extremely rigid aerogels from multifunctional small molecules. Chem. Mater. 25, 3205-3224 (2013).

[22] Zhou, S. et al. One-pot synthesis of robust superhydrophobic, functionalized graphene/polyurethane sponge for effective continuous oil-water separation. Chem. Eng. J. 302, 155-162 (2016).

[23] Ni, J. H. et al. Strong fatigue-resistant nanofibrous hydrogels inspired by lobster underbelly. Matter 4, 1919-1934 (2021).

[24] Picu, R. C. Mechanics of random fiber networks-a review. Soft Matter 7, 6768-6785 (2011).

[25] Gibson, I. J. & Ashby, M. F. The mechanics of three-dimensional cellular materials. Proc. R. Soc. Lond. A 382, 43-59 (1982).

[26] Zhu, J. et al. Branched aramid nanofibers. Angew. Chem. Int Ed. 56, 11744-11748 (2017).

[27] Xu, L. Z., Zhao, X. L., Xu, C. L. & Kotov, N. A. Water-rich biomimetic composites with abiotic self-organizing nanofiber network. Adv. Mater. 30, 1703343 (2018).

[28] Gibson, L. J. Cellular solids. MRS Bull. 28, 270-274 (2003).

[29] Sun, J. Y. et al. Highly stretchable and tough hydrogels. Nature 489, 133-136 (2012).

[30] Broedersz, C. P., Mao, X. M., Lubensky, T. C. & Mackintosh, F. C. Criticality and isostaticity in fibre networks. Nat. Phys. 7, 983-988 (2011).

[31] Wei, X., Zhu, Q., Qian, J., Lin, Y. & Shenoy, V. B. Response of biopolymer networks governed by the physical properties of cross-linking molecules. Soft Matter 12, 2537-2541 (2016).

[32] Chaudhuri, O., Cooper-White, J., Janmey, P. A., Mooney, D. J. & Shenoy, V. B. Effects of extracellular matrix viscoelasticity on cellular behaviour. Nature 584, 535-546 (2020).

[33] Sharma, A. et al. Strain-controlled criticality governs the nonlinear mechanics of fibre networks. Nat. Phys. 12, 584-587 (2016).

[34] Hsu, P. C. et al. Radiative human body cooling by nanoporous polyethylene textile. Science 353, 1019-1023 (2016).

[35] Sun, T. L. et al. Physical hydrogels composed of polyampholytes demonstrate high toughness and viscoelasticity. Nat. Mater. 12, 932-937 (2013).

[36] Crisfield, M. A. Non-linear finite element analysis of solids and structures. Ch17 (John Wiley & Sons, New York, 1997).

[37] Kostikov, V. I. Fiber science and technology Ch3 (Chapman & Hall, London, 1995).

[38] Z. Huang, Y. Hao, Y. Li, H. Hu, C. Wang, A. Nomoto, T. Pan, Y. Gu, Y. Chen, T. Zhang, W. Li, Y. Lei, N. H. Kim, C. Wang, L. Zhang, J. W. Ward, A. Maralani, X. Li, M. F. Durstock, A. Pisano, Y. Lin, S. Xu, Nat. Electron. 2018, 1, 473.

[39] Y. Dai, H. Hu, M. Wang, J. Xu, S. Wang, Nat. Electron. 2021, 4, 17.

[40] N. Matsuhisa, X. Chen, Z. Bao, T. Someya, Chem. Soc. Rev. 2019, 48, 2946.

[41] D. C. Kim, H. J. Shim, W. Lee, J. H. Koo, D. H. Kim, Adv. Mater. 2020, 32, 1902743.

[42] Y. Wang, C. Zhu, R. Pfattner, H. Yan, L. Jin, S. Chen, F. Molina-Lopez, F. Lissel, J. Liu, N. I. Rabiah, Z. Chen, J. W. Chung, C. Linder, M. F. Toney, B. Murmann, Z. Bao, Sci. Adv. 2017, 3, e1602076.

[43] S. Choi, S. I. Han, D. Jung, H. J. Hwang, C. Lim, S. Bae, O. K. Park, C. M. Tschabrunn, M. Lee, S. Y. Bae, J. W. Yu, J. H. Ryu, S. W. Lee, K. Park, P. M. Kang, W. B. Lee, R. Nezafat, T. Hyeon, D. H. Kim, Nat. Nanotechnol. 2018, 13, 1048.

[44] C. Wang, C. Wang, Z. Huang, S. Xu, Adv. Mater. 2018, 30, 1801368.

[45] J. A. Fan, W.-H. Yeo, Y. Su, Y. Hattori, W. Lee, S.-Y. Jung, Y. Zhang, Z. Liu, H. Cheng, L. Falgout, M. Bajema, T. Coleman, D. Gregoire, R. J. Larsen, Y. Huang, J. A. Rogers, Nat. Commun. 2014, 5, 3266.

[46] Y. Wang, L. Yin, Y. Bai, S. Liu, L. Wang, Y. Zhou, C. Hou, Z. Yang, H. Wu, J. Ma, Y. Shen, P. Deng, S. Zhang, T. Duan, Z. Li, J. Ren, L. Xiao, Z. Yin, N. Lu, Y. A. Huang, Sci. Adv. 2020, 6, eabd0996.

[47] L. Xu, S. R. Gutbrod, A. P. Bonifas, Y. Su, M. S. Sulkin, N. Lu, H.-J. Chung, K.-I. Jang, Z. Liu, M. Ying, C. Lu, R. C. Webb, J.-S. Kim, J. I. Laughner, H. Cheng, Y. Liu, A. Ameen, J.-W. Jeong, G.-T. Kim, Y. Huang, I. R. Efimov, J. A. Rogers, Nat. Commun. 2014, 5, 3329.

[48] S. Han, M. K. Kim, B. Wang, D. S. Wie, S. Wang, C. H. Lee, Adv. Mater. 2016, 28, 10257.

[49] Y. Xu, B. Sun, Y. Ling, Q. Fei, Z. Chen, X. Li, P. Guo, N. Jeon, S. Goswami, Y. Liao, S. Ding, Q. Yu, J. Lin, G. Huang, Z. Yan, Proc. Natl. Acad. Sci. U.S.A 2020, 117, 205.

[5] L. Tian, B. Zimmerman, A. Akhtar, K. J. Yu, M. Moore, J. Wu, R. J. Larsen, J. W. Lee, J. Li, Y. Liu, B. Metzger, S. Qu, X. Guo, K. E. Mathewson, J. A. Fan, J. Cornman, M. Fatina, Z. Xie, Y. Ma, J. Zhang, Y. Zhang, F. Dolcos, M. Fabiani, G. Gratton, T. Bretl, L. J. Hargrove, P. V. Braun, Y. Huang, J. A. Rogers, Nat. Biomed. Eng. 2019, 3, 194.

[51] Z. Li, M. Zhu, J. Shen, Q. Qiu, J. Yu, B. Ding, Adv. Funct. Mater. 2019, 30, 1908411.

[52] Y. Zhang, T. Zhang, Z. Huang, J. Yang, Adv. Sci. 2022, 2105084.

[53] D.-H. Kim, J. Viventi, J. J. Amsden, J. Xiao, L. Vigeland, Y.-S. Kim, J. A. Blanco, B. Panilaitis, E. S. Frechette, D. Contreras, D. L. Kaplan, F. G. Omenetto, Y. Huang, K.-C. Hwang, M. R. Zakin, B. Litt, J. A. Rogers, Nat. Mater. 2010, 9, 511.

[54] S. Liu, Y. Rao, H. Jang, P. Tan, N. Lu, Matter 2022, 5, 1104.

[55] M. K. Blees, A. W. Barnard, P. A. Rose, S. P. Roberts, K. L. McGill, P. Y. Huang, A. R. Ruyack, J. W. Kevek, B. Kobrin, D. A. Muller, P. L. McEuen, Nature 2015, 524, 204.

[56] T. C. Shyu, P. F. Damasceno, P. M. Dodd, A. Lamoureux, L. Xu, M. Shlian, M. Shtein, S. C. Glotzer, N. A. Kotov, Nat. Mater. 2015, 14, 785.

[57] Y. Morikawa, S. Yamagiwa, H. Sawahata, R. Numano, K. Koida, M. Ishida, T. Kawano, Adv. Healthc. Mater. 2018, 7, 1701100.

[58] A. Lamoureux, K. Lee, M. Shlian, S. R. Forrest, M. Shtein, Nat. Commun. 2015, 6, 7373.

[59] K. Yong, S. De, E. Y. Hsieh, J. Leem, N. R. Aluru, Mater. Today 2020, 34, 58.

[60] L. Xu, T. C. Shyu, N. A. Kotov, ACS Nano 2017, 11, 7587.

[61] H. Li, H. Liu, M. Sun, Y. Huang, L. Xu, Adv. Mater. 2020, 33, 2004425.

[62] R. Zhao, S. Lin, H. Yuk, X. Zhao, Soft Matter 2018, 14, 2515.

[62] A. Das, A. Sinha, V. R. Rao, K. N. Jonnalagadda, Exp. Mech. 2017, 57, 687.

[63] R. Ballarini, R. L. Mullen, Y. Yin, H. Kahn, S. Stemmer, A. H. Heuer, J. Mater. Res. 1997, 12, 915.

[64] M. Pharr, Z. Suo, J. J. Vlassak, Nano Lett. 2013, 13, 5570.

[65] J. Lyu, X. Wang, L. Liu, Y. Kim, E. K. Tanyi, H. Chi, W. Feng, L. Xu, T. Li, M. A. Noginov, C. Uher, M. D. Hammig, N. A. Kotov, Adv. Funct. Mater. 2016, 26, 8435.

[66] H. Li, Z. Wang, M. Sun, H. Zhu, H. Liu, C. Y. Tang, L. Xu, Adv. Funct. Mater. 2022, 2202792. DOI: 10.1002/adfm.202202792

[67] Crisfield, M. A. Non-linear finite element analysis of solids and structures. Ch7, John Wiley & Sons, New York, 1997.

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

The invention claimed is:

1. A composite nanofiber aerogel (CNA) comprising aramid nanofibers (ANFs) combined with polyvinyl alcohol (PVA), wherein the composite nanofiber aerogel is created by forming a dispersion of about 3% wt of the ANFs dissolved in dimethyl sulfoxide (DMSO) in about 7 days, forming a dispersion of about 15% wt of the PVA dissolved in the DMSO in about 7 days, mixing the ANF dispersion with the PVA dispersion in a mass ratio of 1:1 to form a precursor liquid, conducting a solvent exchange in deionized (DI) water leading to solid hydrogels and immersing the hydrogels in ethanol for about another 24 hours, and conducting critical point drying (CPD), whereby a solid foam aerogel with nanoscale porosity is formed, and wherein nanoscale constituents of the aerogel form 3D networks with nodal connectivity and welded connectivity nodal joints between fibrils so that the aerogel has a fracture energy of about 4,697 $Jm^{-2}$, a 76% porosity and a toughness of about 1,050 $kJ/m^3$ and wherein successive breakage of crosslinks at the connectivity nodal joints affords energy dissipation while maintaining the overall structural integrity.

2. The composite nanofiber aerogel according to claim 1 wherein average pore sizes of the CNA range from 140 nm to 1,463 nm and can be adjusted by adjusting a solid content of the composite nanofiber aerogel.

3. The composite nanofiber aerogel according to claim 1 wherein air permeability with a thickness of ~20 μm results in a pressure drop of 0.9-2.2 kPa under a face velocity of 0.05 $ms^{-1}$.

4. A method for forming a composite nanofiber aerogel (CNA) comprising the steps of:

forming a dispersion of about 3% wt of aramid nanofibers (ANFs) in dimethyl sulfoxide (DMSO) in about 7 days, forming a dispersion of about 15% wt of polyvinyl alcohol (PVA) dissolved in the DMSO in about 7 days;

mixing the ANF-DMSO dispersion with the PVA in the DMSO dispersion to form a precursor liquid, wherein the mixing of the ANF-DMSO dispersion with the dissolved PVA in the DMSO dispersion was in a 1:1 mass ratio, conducting a solvent exchange in deionized (DI) water leading to solid hydrogels and immersing the hydrogels in ethanol for about another 24 hours, and conducting critical point drying (CPD), whereby a solid foam aerogel with nanoscale porosity is formed, wherein the solid foam aerogel is having a fracture energy of about 4,697 $Jm^{-2}$, a 76% porosity and a toughness of about 1,050 $kJ/m^3$.

5. The method of claim 4 further including the step of casting the liquid precursor into a 3D mold to yield a bulk aerogel sample.

6. The method of claim 4 further including the step of spin-coating or doctor-blading the liquid precursor to generate aerogel films.

7. The method of claim 5 further including the step of ablating the aerogel with an infrared laser to machine the aerogel sample at millimeter scale.

8. The method of claim 6 further including the step of ablating the aerogel with an infrared laser to machine the aerogel film at millimeter scale.

9. The method of claim 4 wherein the aramid nanofibers are Kevlar para aramid pulp, both steps of forming the dispersions were achieved under magnetic stirring at 95° C.

* * * * *